(12) United States Patent
Bae et al.

(10) Patent No.: US 11,631,726 B2
(45) Date of Patent: *Apr. 18, 2023

(54) DISPLAY PANEL AND DISPLAY DEVICE INCLUDING THE SAME

(71) Applicant: Samsung Display Co., Ltd., Yongin-si (KR)

(72) Inventors: Injun Bae, Yongin-si (KR); Donghwi Kim, Yongin-si (KR); Chulho Kim, Yongin-si (KR); Woori Seo, Yongin-si (KR); Jin Jeon, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/545,840

(22) Filed: Dec. 8, 2021

(65) Prior Publication Data
US 2022/0102454 A1 Mar. 31, 2022

Related U.S. Application Data

(63) Continuation of application No. 16/752,117, filed on Jan. 24, 2020, now Pat. No. 11,201,201.

(30) Foreign Application Priority Data

Mar. 28, 2019 (KR) ........................ 10-2019-0036198

(51) Int. Cl.
*H01L 27/32* (2006.01)
*H01L 51/56* (2006.01)

(52) U.S. Cl.
CPC ...... *H01L 27/3258* (2013.01); *H01L 27/3248* (2013.01); *H01L 27/3262* (2013.01); *H01L 27/3265* (2013.01); *H01L 27/3276* (2013.01); *H01L 51/56* (2013.01); *H01L 2251/558* (2013.01)

(58) Field of Classification Search
CPC ............. H01L 27/3258; H01L 27/3248; H01L 27/3262; H01L 27/3265; H01L 2251/558
See application file for complete search history.

(56) References Cited

U.S. PATENT DOCUMENTS

| | | | |
|---|---|---|---|
| 9,634,074 B2 | 4/2017 | Son et al. | |
| 11,201,201 B2* | 12/2021 | Bae | H01L 27/3248 |
| 2016/0133681 A1 | 5/2016 | Nam et al. | |
| 2017/0287936 A1 | 10/2017 | Kim et al. | |
| 2018/0012947 A1 | 1/2018 | Lee et al. | |
| 2018/0107241 A1 | 4/2018 | Evans et al. | |
| 2019/0123119 A1 | 4/2019 | Miyamoto et al. | |
| 2019/0197965 A1 | 6/2019 | Park et al. | |

FOREIGN PATENT DOCUMENTS

| | | |
|---|---|---|
| CN | 106920812 A | 7/2017 |
| KR | 10-2016-0096760 A | 8/2016 |
| KR | 10-2018-0060861 A | 6/2018 |

* cited by examiner

*Primary Examiner* — Mark W Tornow
(74) *Attorney, Agent, or Firm* — Lewis Roca Rothgerber Christie LLP

(57) ABSTRACT

A display panel includes a substrate, a transistor on the substrate, a storage capacitor on the substrate and electrically connected to the transistor, a metal layer between the substrate and the transistor, a first insulating layer on the metal layer and having a first contact hole, and a wiring connected to the metal layer through the first contact hole, wherein the first insulating layer having a first hole apart from the transistor.

18 Claims, 28 Drawing Sheets

DISPLAY PANEL AND DISPLAY DEVICE INCLUDING THE SAME

CROSS-REFERENCE TO RELATED APPLICATIONS

This application is a continuation of U.S. patent application Ser. No. 16/752,117, filed Jan. 24, 2020, which claims priority to and the benefit of Korean Patent Application No. 10-2019-0036198, filed Mar. 28, 2019, the entire content of both of which is incorporated herein by reference.

BACKGROUND

1. Field

Aspects of the present invention are related to a display panel having a transmission area and a display device including the display panel.

2. Description of the Related Art

Recently, the application areas of display devices have become more diversified. As display devices have become thinner and more lightweight, their range of use has gradually been extended.

As the area occupied by a display area of display devices increases, functions that may be combined or associated with a display device are being added. As a way of adding various functions while increasing the display area, research into display devices in which various elements may be arranged in a display area is in progress.

SUMMARY

Aspects of some of embodiments are directed to a display panel and a display device including the display panel, the display panel including a region in which various suitable kinds of components may be arranged inside a display area. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to some embodiments, there is provided a display panel including: a substrate; a transistor on the substrate; a storage capacitor on the substrate and electrically connected to the transistor; a metal layer between the substrate and the transistor; a first insulating layer on the metal layer and having a first contact hole; and a wiring connected to the metal layer through the first contact hole, wherein the first insulating layer having a first hole apart from the transistor.

In some embodiments, the first insulating layer includes a plurality of sub-layers.

In some embodiments, a number of layers defining the first contact hole is the same as a number of layers defining the first hole.

In some embodiments, a material change of a lateral surface of the first contact hole in a depth direction of the first contact hole is the same as a material change of a lateral surface of the first hole in a depth direction of the first hole.

In some embodiments, the display panel further includes: a second insulating layer on the first insulating layer and having a second hole overlapping the first hole.

In some embodiments, the second insulating layer further has a second contact hole for connection between a source electrode or a drain electrode of the transistor and a semiconductor layer of the transistor.

In some embodiments, a number of layers defining the second contact hole is the same as a number of layers defining the second hole.

In some embodiments, a material change of a lateral surface of the second contact hole in a depth direction of the second contact hole is the same as a material change of a lateral surface of the second hole in a depth direction of the second hole.

In some embodiments, a width of the second hole is different from a width of the first hole.

In some embodiments, the metal layer has the same voltage level as that of a gate electrode of the transistor.

In some embodiments, the display panel further includes: a driving voltage line electrically connected to the transistor and the storage capacitor, wherein the metal layer has the same voltage level as that of the driving voltage line.

According to some embodiments, there is provided a display device including: a substrate; a transistor and a storage capacitor on the substrate; a metal layer between the substrate and the transistor; a first insulating layer on the metal layer and having a first contact hole; a wiring connected to the metal layer through the first contact hole; and a component arranged below the substrate, wherein the first insulating layer having a first hole apart from the transistor, and wherein the component corresponds to the first hole.

In some embodiments, a number of layers defining the first contact hole is the same as a number of layers defining the first hole.

In some embodiments, a material change of a lateral surface of the first contact hole in a depth direction of the first contact hole is the same as a material change of a lateral surface of the first hole in a depth direction of the first hole.

In some embodiments, the display device further includes: a second insulating layer on the first insulating layer and having a second hole overlapping the first hole.

In some embodiments, the second insulating layer further has a second contact hole for connection between a source electrode or a drain electrode of the transistor and a semiconductor layer of the transistor.

In some embodiments, a number of layers defining the second contact hole is the same as a number of layers defining the second hole.

In some embodiments, a material change of a lateral surface of the second contact hole in a depth direction of the second contact hole is the same as a material change of a lateral surface of the second hole in a depth direction of the second hole.

In some embodiments, a width of the second hole is different from a width of the first hole.

In some embodiments, the metal layer has the same voltage level as that of a gate electrode of the transistor.

In some embodiments, the display device further includes: a driving voltage line electrically connected to the transistor and the storage capacitor, wherein the metal layer has the same voltage level as that of the driving voltage line.

In some embodiments, the substrate includes: a first region in which a first display element is positioned; a second region in which a second display element is positioned; and a third region in which the first hole is positioned, wherein the transistor, the storage capacitor, and the metal layer are in the second region, and wherein the transistor and the storage capacitor are electrically connected to the second display element.

In some embodiments, the component corresponds to the second region and the third region, and the metal layer overlaps a portion of the component.

In some embodiments, the component includes an electronic element that emits and/or receives light.

In some embodiments, the display device further includes: a second component corresponding to the second region and different from the component.

These and/or other aspects will become apparent and more readily appreciated from the following description of the embodiments, taken in conjunction with the accompanying drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
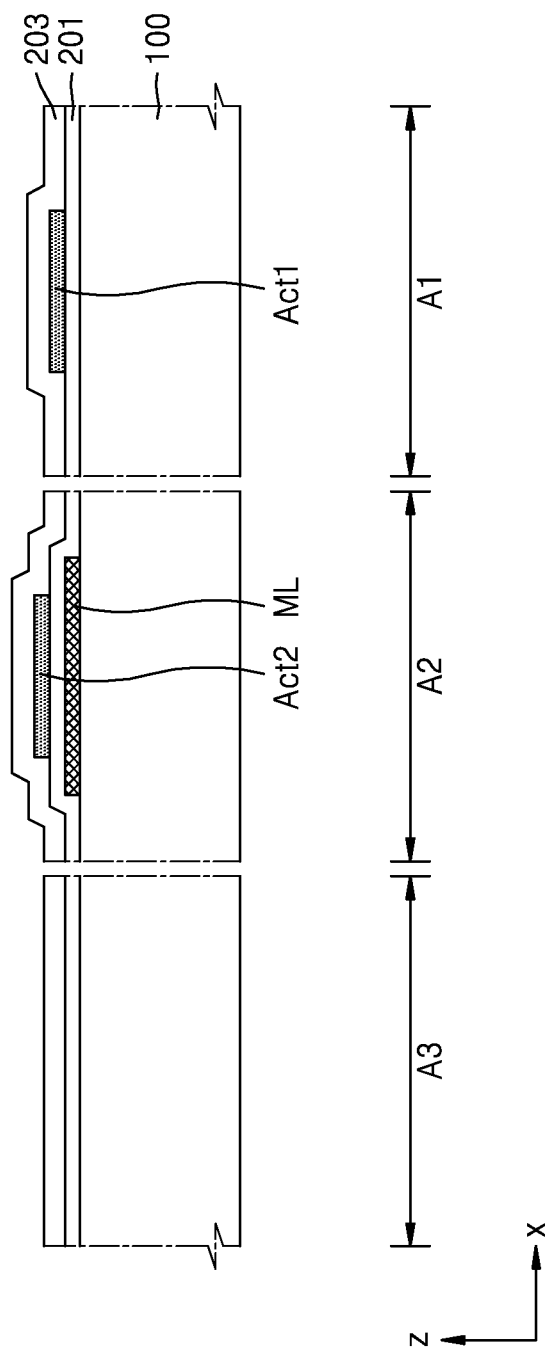
FIG. 1 is a cross-sectional view of one process of manufacturing a display panel, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIGS. 1 to 8 are cross-sectional views of a process of manufacturing a display panel according to an embodiment.

Referring to FIG. 1, a substrate 100 may include a first region A1, a second region A2, and a third region A3. The substrate 100 includes a transparent material. For example, the substrate 100 may include a glass material or a polymer resin.

A metal layer ML is formed in the second region A2 of the substrate 100. The metal layer ML may include Al, Pt, Pd, Ag, Mg, Au, Ni, Nd, Ir, Cr, Li, Ca, Mo, Ti, W Cu, and/or the like. The metal layer ML may include a single layer or a multi-layer including the above materials. In an embodiment, the metal layer ML may include a layer including Mo.

A buffer layer 201 may be formed on the substrate 100 on which the metal layer ML is formed. The buffer layer 201 may include an inorganic insulating material such as silicon nitride (SiN$_x$, x>0), silicon oxynitride (SiON), and silicon oxide (SiO$_x$, x>0). The buffer layer 201 may include a single layer or a multi-layer including the above inorganic insulating materials. The buffer layer 201 may be formed on the substrate 100 to cover an entire surface of the first region A1, the second region A2, and the third region A3.

Then, a first semiconductor layer Act1 and a second semiconductor layer Act2 are respectively formed in the first region A1 and the second region A2. The first semiconductor layer Act1 and the second semiconductor layer Act2 may include polycrystalline silicon. In another embodiment, the first semiconductor layer Act1 and the second semiconductor layer Act2 may include amorphous silicon. In another embodiment, the first semiconductor layer Act1 and the second semiconductor layer Act2 may include an oxide semiconductor including In, Ga, Sn, Zr, V, Hf, Cd, Ge, Cr, Ti, Zn, and/or the like. For example, the first semiconductor layer Act1 and the second semiconductor layer Act2 may include an oxide semiconductor such as indium gallium zinc oxide (IGZO), zinc tin oxide (ZTO), and zinc indium oxide (ZIO).

The first semiconductor layer Act1 may overlap the metal layer ML. In an embodiment, a width of the first semiconductor layer Act1 may be less than a width of the metal layer ML. Therefore, when viewed in a direction perpendicular to the substrate 100, an entire surface of the first semiconductor layer Act1 may overlap the metal layer ML.

The first semiconductor layer Act1 and the second semiconductor layer Act2 may be covered by a gate insulating layer 203. The gate insulating layer 203 may include an inorganic insulating material such as silicon nitride (SiN$_x$, x>0), silicon oxynitride (SiON), and silicon oxide (SiO$_x$, x>0). The gate insulating layer 203 may include a single layer or a multi-layer including the above inorganic insulating materials. The gate insulating layer 203 may be formed over the substrate 100 to cover an entire surface of the first region A1, the second region A2, and the third region A3.

Figure 2:
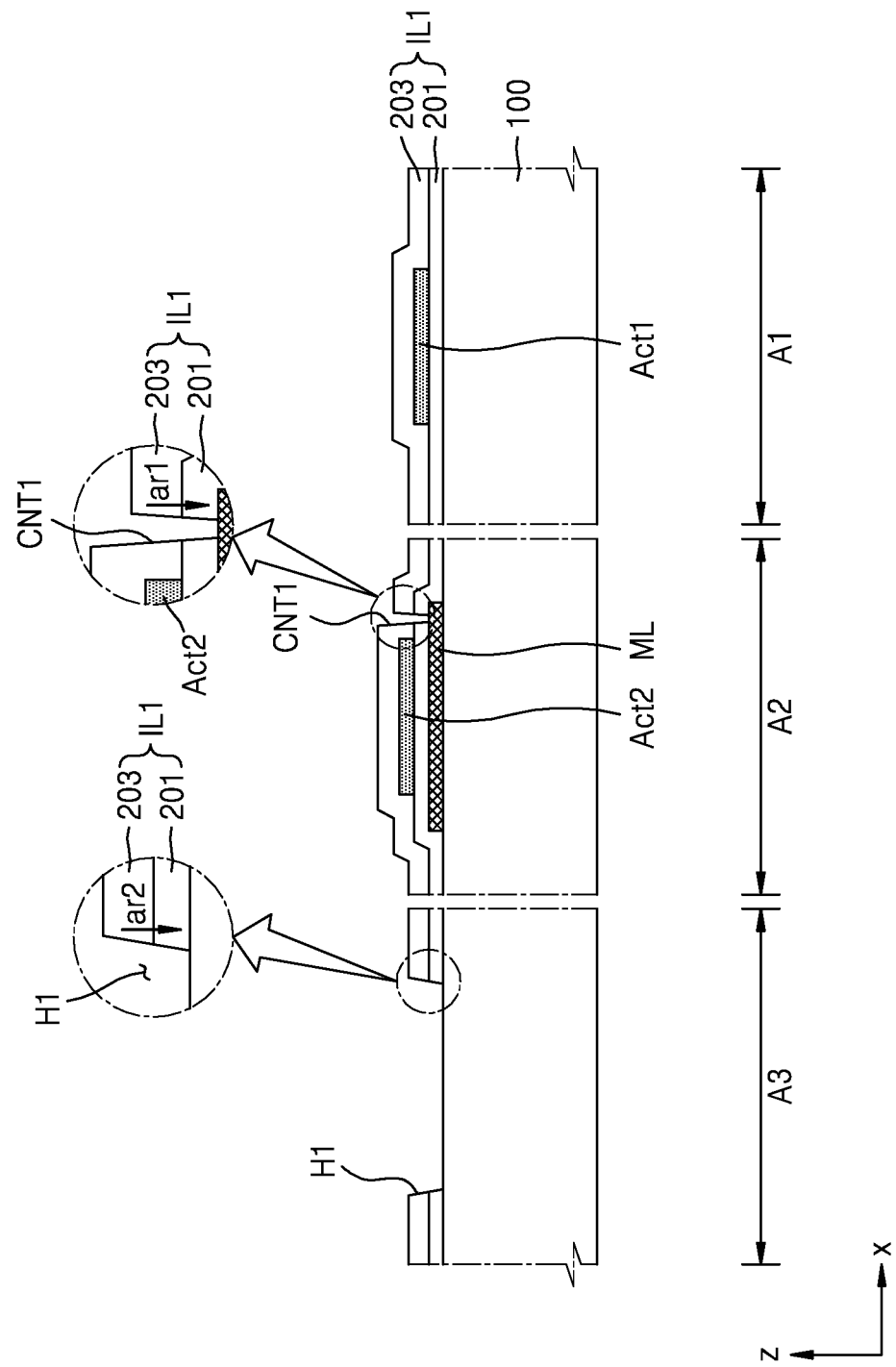
FIG. 2 is a cross-sectional view of one process of manufacturing a display panel, according to an example embodiment.

Referring to FIG. 2, a first contact hole (i.e., a first contact opening) CNT1 and a first hole (i.e., a first opening) H1 are formed. The first contact hole CNT1 and the first hole H1 may be formed to pass through a first insulating layer IL1 on the substrate 100 and/or the metal layer ML. For example, the first contact hole CNT1 and the first hole H1 may be formed to pass through the buffer layer 201 and the gate insulating layer 203.

The first contact hole CNT1 may be formed to pass through the buffer layer 201 and the gate insulating layer 203 located in the second region A2. A portion of the metal layer ML that is arranged in the second region A2 may be exposed through the first contact hole CNT1. The first hole H1 may be formed to pass through a portion of the buffer layer 201 and the gate insulating layer 203 that is located in the third region A3. A portion of a layer located under the buffer layer 201, for example, the substrate 100 may be exposed through the first hole H1.

The first contact hole CNT1 may be formed during the same process as that of forming the first hole H1. Lateral surfaces of the first insulating layer IL1 that surround the first contact hole CNT1 may define the first contact hole CNT1. Lateral surfaces of the first insulating layer IL1 that surround the first hole H1 may define the first hole H1. For example, it may be understood that lateral surfaces of the first insulating layer IL1 that surround the first contact hole CNT1 are lateral surfaces of the first contact hole CNT1, and lateral surfaces of the first insulating layer IL1 that surround the first hole H1 are lateral surfaces of the first hole H1.

A material change of the first insulating layer IL1 in a depth (a thickness) direction of the first contact hole CNT1 may be the same as a material change of the first insulating layer IL1 in a depth (a thickness) direction of the first hole H1. Likewise, a material change of the lateral surface of the first contact hole CNT1 in the depth (the thickness) direction of the first contact hole CNT1 may be substantially the same as a material change of the lateral surface of the first hole H1 in the depth (the thickness) direction of the first hole H1.

For example, described is the case in which the buffer layer 201, which is a sub-layer of the first insulating layer IL1, includes a double layer of a silicon nitride layer and a silicon oxide layer, and the gate insulating layer 203, which is a sub-layer of the first insulating layer IL1, includes a single layer of a silicon oxide layer. Referring to an enlarged view of the second region A2 of FIG. 2, a material change in the thickness (the depth) direction (e.g. an ar1 direction) of the first insulating layer IL1 defining the first contact hole CNT1 may occur in a sequence of silicon oxide-silicon oxide-silicon nitride. Since the first hole H1 is formed to pass through the same insulating layer during the same process as a process of forming the first contact hole CNT1, as shown in an enlarged view of the third region A3 of FIG. 2, a material change in the thickness (the depth) direction (e.g. an ar2 direction) of the first insulating layer IL1 defining the first hole H1 may also occur in a sequence of silicon oxide-silicon oxide-silicon nitride.

The first contact hole CNT1 is formed during the same process as that of forming the first hole H1, and the number of layers defining the first contact hole CNT1 is the same as the number of layers defining the first hole H1. In an embodiment, in the case where the buffer layer 201, which is a sub-layer of the first insulating layer IL1, includes a double layer of a silicon nitride layer and a silicon oxide layer, and the gate insulating layer 203, which is a sub-layer of the first insulating layer IL1, includes a single layer of a silicon oxide layer, the number of layers defining the first contact hole CNT1 is three, which is equal to three layers defining the first hole H1. The number of layers defining the first contact hole CNT1 and the first hole H1 may be determined by the number of interfaces between layers.

Figure 3:
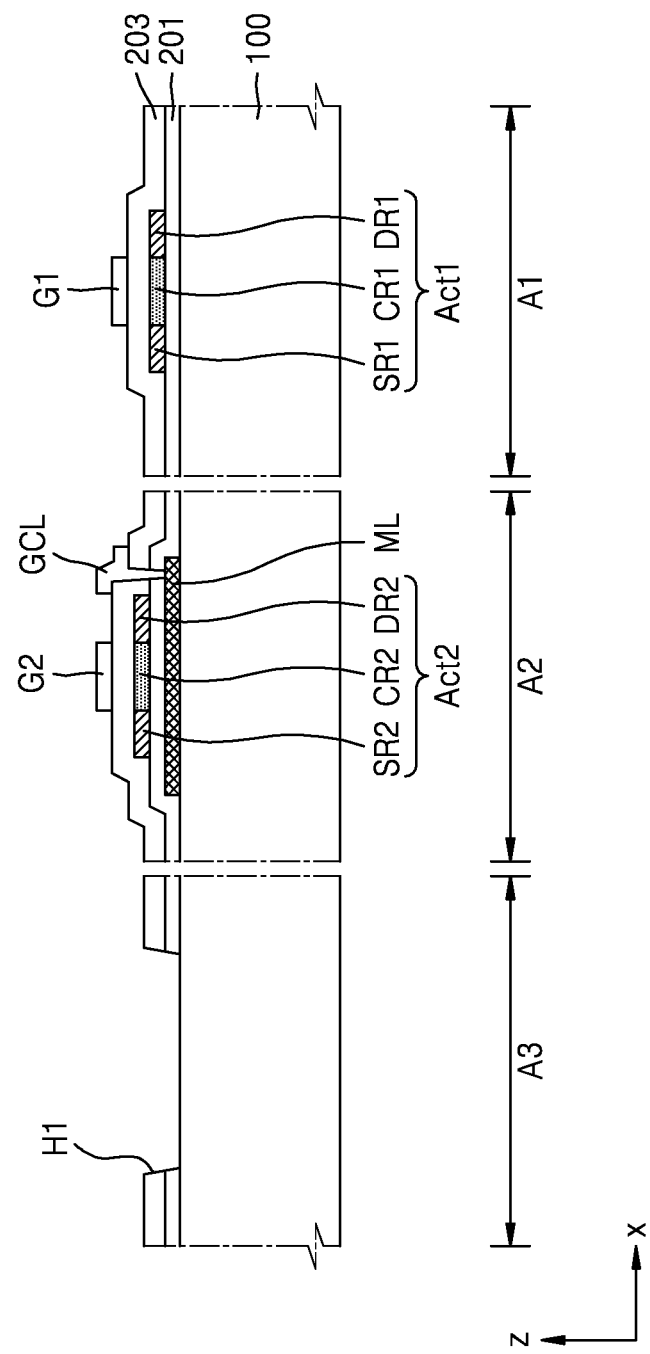
FIG. 3 is a cross-sectional view of one process of manufacturing a display panel, according to an example embodiment.

Referring to FIG. 3, a first gate electrode G1 and a second gate electrode G2 are formed over the substrate 100 in which the first contact hole CNT1 and the first hole H1 are formed. The first gate electrode G1 may be located over the first semiconductor layer Act1 in the first region A1, and the second gate electrode G2 may be located over the second semiconductor layer Act2 in the second region A2.

Each of the first gate electrode G1 and the second gate electrode G2 may include Al, Pt, Pd, Ag, Mg, Au, Ni, Nd, Ir, Cr, Li, Ca, Mo, Ti, W, Cu, and/or the like. The first gate electrode G1 and the second gate electrode G2 may include a single layer or a multi-layer including the above materials. In an embodiment, the first gate electrode G1 and the second gate electrode G2 may include the same material as that of the metal layer ML or a material different from that of the metal layer ML.

A wiring GCL may be formed during a process of forming the first gate electrode G1 and the second gate electrode G2. The wiring GCL may include the same material as that of the first gate electrode G1 and the second gate electrode G2. The wiring GCL may be connected to the metal layer ML through the first contact hole CNT1 and may transfer a signal (e.g., a predetermined signal), for example, a gate signal. In the second region A2, the metal layer ML may be utilized as a gate electrode. For example, the second gate electrode G2 may serve as a top gate electrode, and the metal layer ML may serve as a bottom gate electrode.

After the first gate electrode G1 and the second gate electrode G2 are formed, the first semiconductor layer Act1 and the second semiconductor layer Act2 may be doped with impurities by respectively using the first gate electrode G1 and the second gate electrode G2 as self-aligned masks. The first semiconductor layer Act1 may include a first channel region CR1, a first source region SR1, and a first drain region DR1. The first channel region CR1 may be overlapped the first gate electrode G1, and the first source region SR1 and the first drain region DR1 may be doped with impurities. The second semiconductor layer Act2 may include a second channel region CR2, a second source region SR2, and a second drain region DR2. The second channel region CR2 may overlap the second gate electrode G2, and the second source region SR2 and the second drain region DR2 may be doped with impurities.

Figure 4:
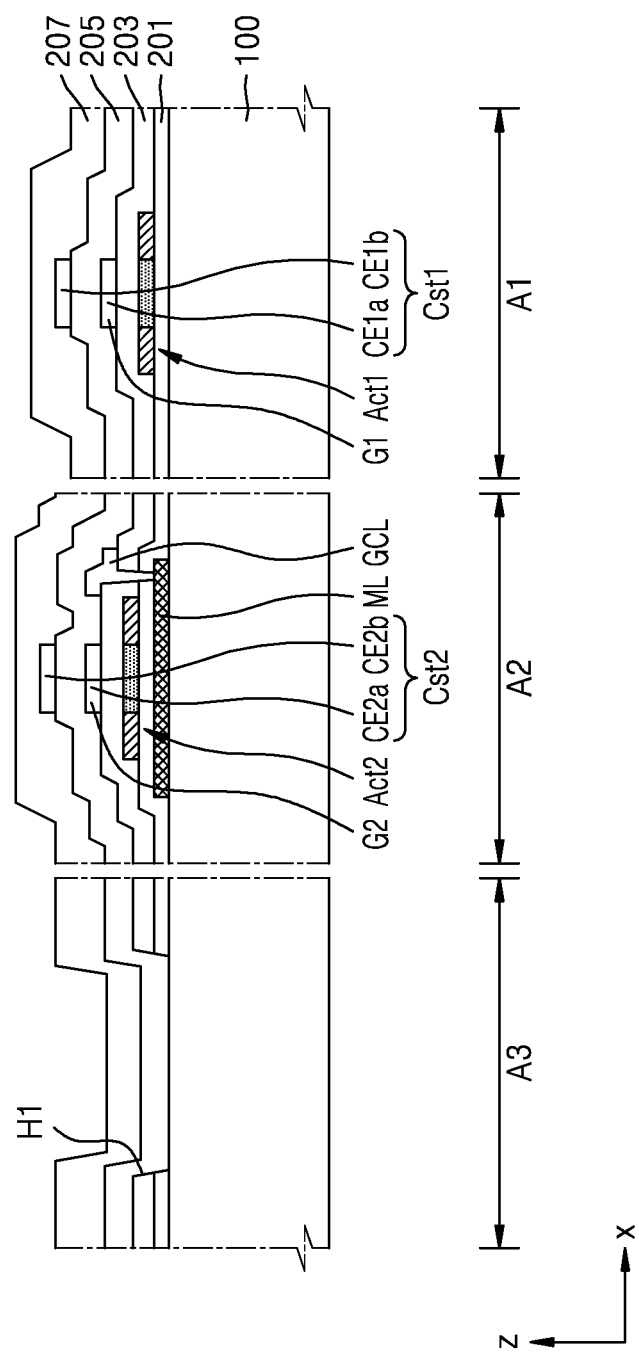
FIG. 4 is a cross-sectional view of one process of manufacturing a display panel, according to an example embodiment.

Referring to FIG. 4, a first interlayer insulating layer 205 is formed over the substrate 100 over which the first gate electrode G1, the second gate electrode G2, and the wiring GCL are formed. Then, a first electrode layer CE1b and a second electrode layer CE2b are formed, the first electrode layer CE1b and the second electrode layer CE2b respectively overlapping the first gate electrode G1 and the second gate electrode G2.

The first interlayer insulating layer 205 may include an inorganic insulating material such as silicon oxide, silicon nitride, and silicon oxynitride and may include a single layer or a multi-layer including the above inorganic insulating materials.

In the first region A1, the first electrode layer CE1b may overlap the first gate electrode G1 therebelow. The first gate electrode G1 and the first electrode layer CE1b may constitute a first storage capacitor Cst1, the first gate electrode G1 and the first electrode layer CE1b overlapping each other with the first interlayer insulating layer 205 therebetween. The first gate electrode G1 may serve as a lower electrode CE1a of the first storage capacitor Cst1, and the first electrode layer CE1b may serve as an upper electrode of the first storage capacitor Cst1.

In the second region A2, the second electrode layer CE2b may overlap the second gate electrode G2 therebelow. The second gate electrode G2 and the second electrode layer CE2b may constitute a second storage capacitor Cst2, the second gate electrode G2 and the second electrode layer CE2b overlapping each other with the first interlayer insulating layer 205 therebetween. The second gate electrode G2 may serve as a lower electrode CE2a of the second storage capacitor Cst2, and the second electrode layer CE2b may serve as an upper electrode of the second storage capacitor Cst2.

The first electrode layer CE1b and the second electrode layer CE2b may include Al, Pt, Pd, Ag, Mg, Au, Ni, Nd, Ir, Cr, Li, Ca, Mo, Ti, W, Cu, and/or the like and may include a single layer or a multi-layer including the above materials.

Then, a second interlayer insulating layer 207 is formed. The second interlayer insulating layer 207 may include an inorganic insulating material such as silicon oxide, silicon nitride, and silicon oxynitride and may include a single layer or a multi-layer including the above inorganic insulating materials. The first interlayer insulating layer 205 and the second interlayer insulating layer 207 may cover an entire surface of the substrate 100. Therefore, the first hole H1 in the third region A3 may be covered by the first interlayer insulating layer 205 and the second interlayer insulating layer 207.

Figure 5A:
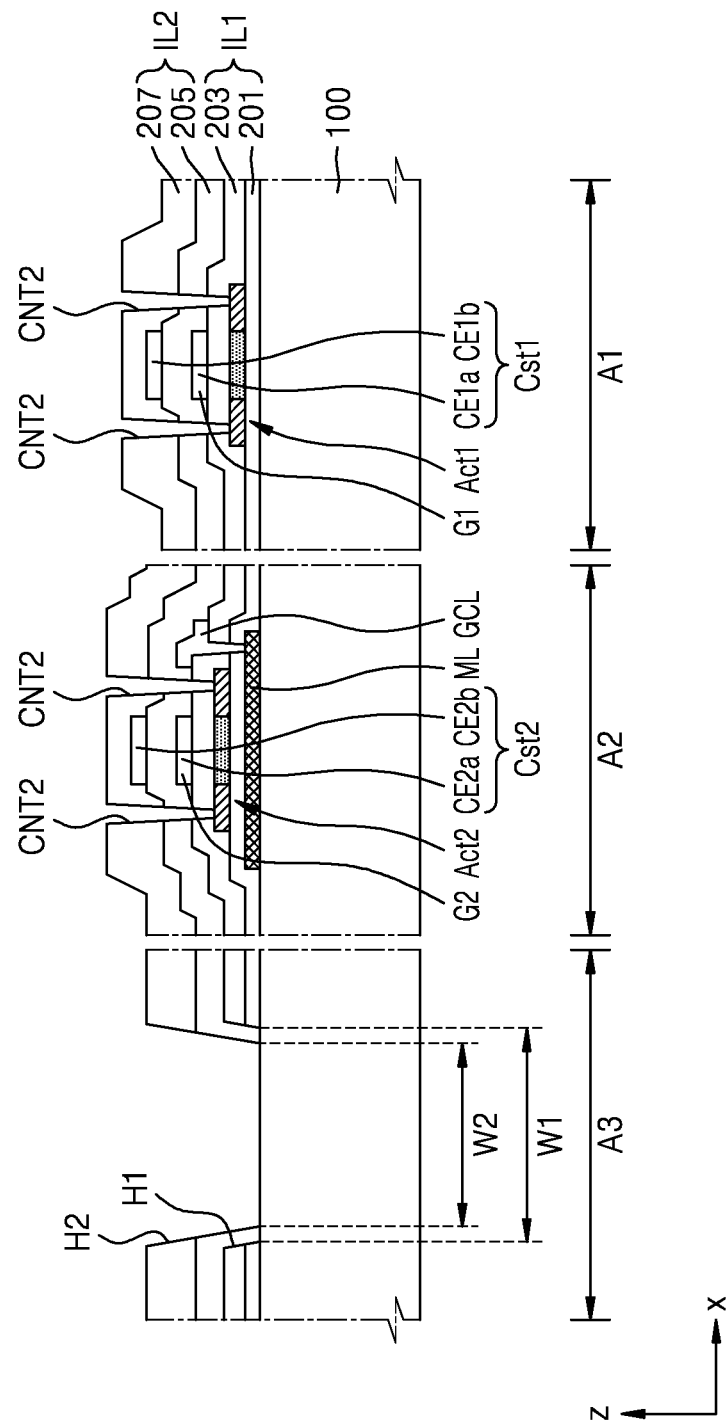
FIGS. 5A to 5D are cross-sectional views of one process of manufacturing a display panel, according to an example embodiment.

Referring to FIG. 5A, a second contact hole (i.e., a second contact opening) CNT2 and a second hole (i.e., a second opening) H2 are formed. The second contact hole CNT2 and the second hole H2 may be formed to pass through a second insulating layer IL2. The second contact hole CNT2 is formed in the first region A1 and the second region A2. The second hole H2 is formed in the third region A3. The second contact hole CNT2 may be formed to pass through the gate insulating layer 203, the first interlayer insulating layer 205, and the second interlayer insulating layer 207. The second hole H2 may be formed to pass through the first interlayer insulating layer 205 and the second interlayer insulating layer 207.

The second hole H2 may be defined by lateral surfaces of the second insulating layer IL2 that surround the second hole H2. For example, in the case where the first interlayer insulating layer 205 is a single layer and the second interlayer insulating layer 207 is a single layer, the first interlayer insulating layer 205 and the second interlayer insulating layer 207 being sub-layers of the second insulating layer IL2, the number of layers defining the second hole H2 may be two. The number of layers defining the second hole H2 may be the same as the number of layers between the wiring GCL and a second source electrode SE2 (see FIG. 6), which is to be formed during a process described below. The number of layers defining the second hole H2 may be the same as the number of layers between the wiring GCL and a second drain electrode DE2 (see FIG. 6), which is to be formed during a process described below.

In the first region A1, the first source region SR1, and/or the first drain region DR1 of the first semiconductor layer Act1 may be exposed through the second contact hole CNT2. In the second region A2, the second source region SR2, and/or the second drain region DR2 of the second semiconductor layer Act2 may be exposed through the second contact hole CNT2.

Figure 5B:
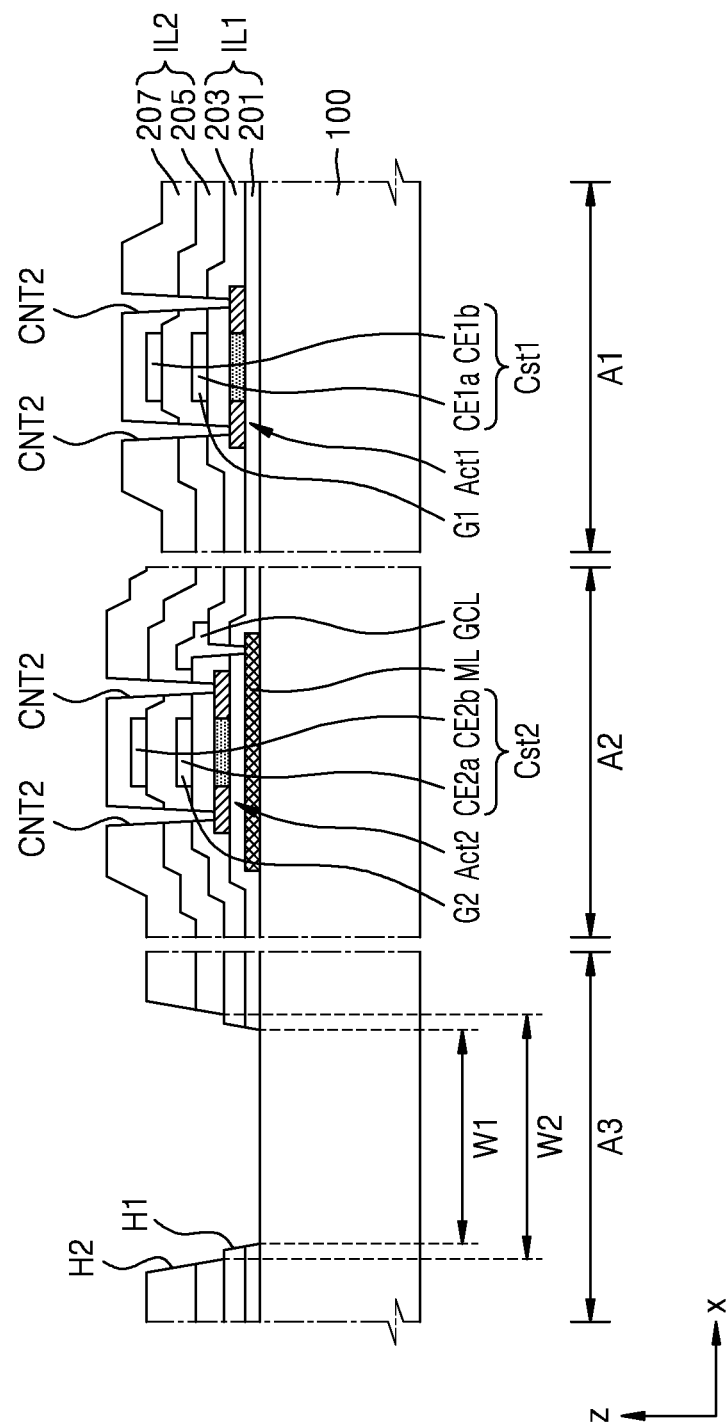
Figure 5C:
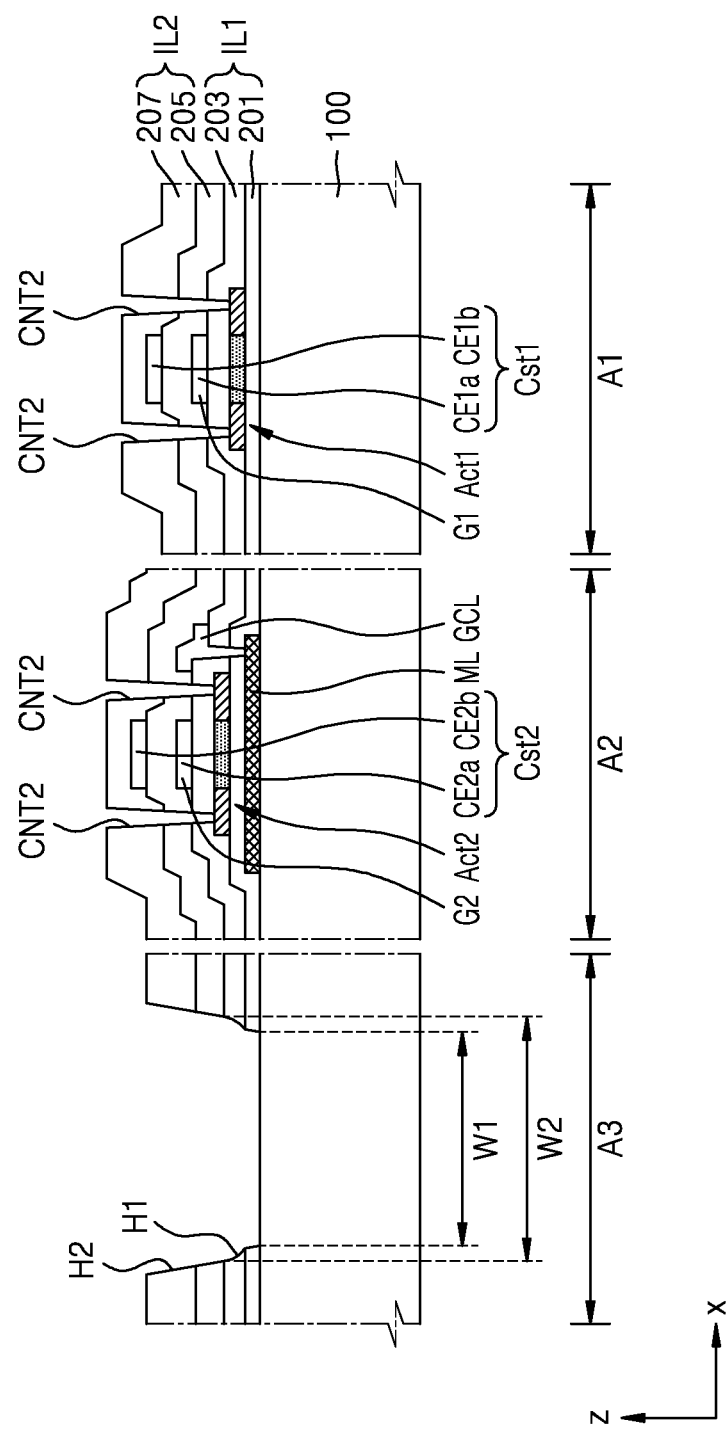
Figure 5D:
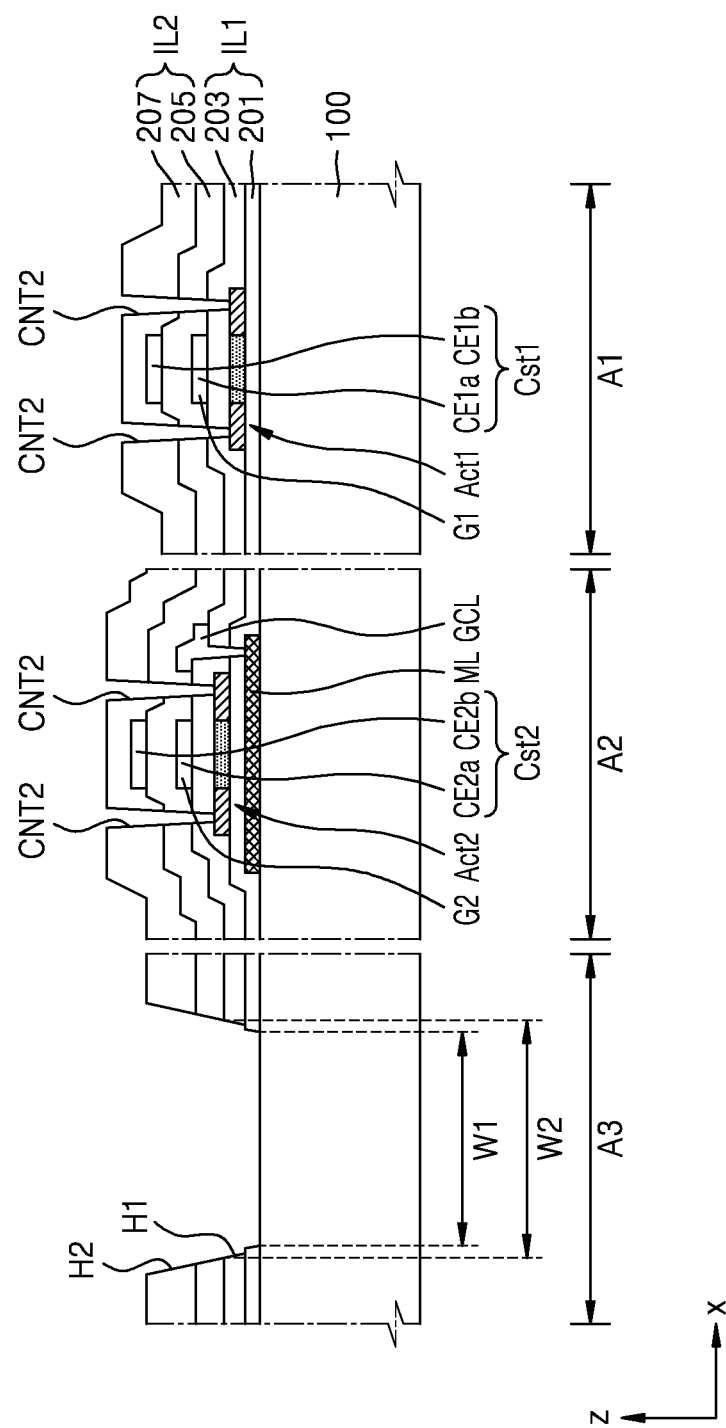

The second hole H2 formed in the third region A3 overlaps the first hole H1. As shown in FIG. 5A, a width W2 of the second hole H2 may be less than a width W1 of the first hole H1. In another embodiment, as shown in FIG. 5B, the width W2 of the second hole H2 may be greater than the width W1 of the first hole H1. In an embodiment, depending on whether materials of the gate insulating layer 203 and the first interlayer insulating layer 205 are different from each other and/or a condition of a process (e.g. an etching process) of forming the second hole H2, a connection portion of the second hole H2 and the first hole H1 may constitute a step difference as shown in FIG. 5B, or a connection portion of the second hole H2 and the first hole H1 may constitute an inclined surface (a gentle inclined surface or an inclined surface having bending) as shown in FIG. 5C, or a lateral surface itself of the first insulating layer IL1 constituting the first hole H1 may have a step difference as shown in FIG. 5D while a portion of the lateral surfaces of the first insulating layer IL1 that define the first hole H1 is removed during an etching process of forming the second hole H2. In the drawings below, for convenience of description, as shown in FIG. 5A, description is made to the case where the width W2 of the second hole H2 is less than the width W1 of the first hole H1.

Figure 6:
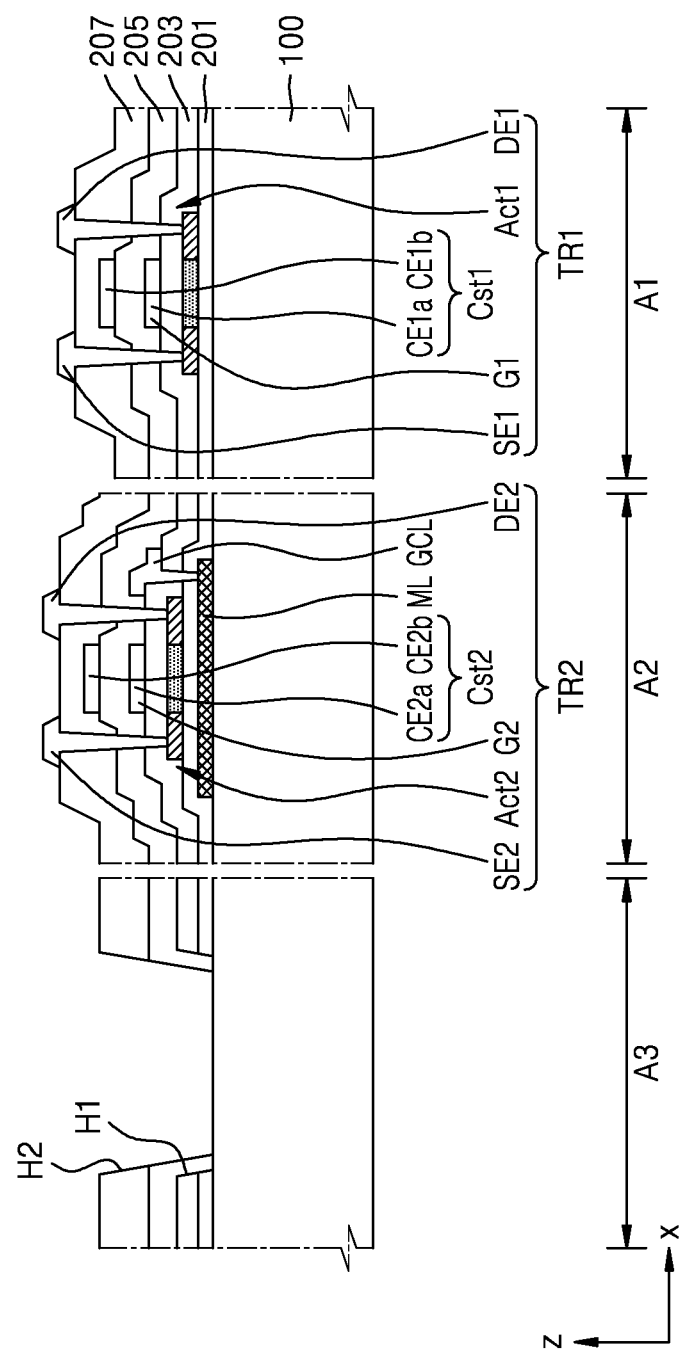
FIG. 6 is a cross-sectional view of one process of manufacturing a display panel, according to an example embodiment.

Referring to FIG. 6, a source electrode and/or a drain electrode are formed over the substrate 100 in which the second contact hole CNT2 and the second hole H2 are formed. With regard to this, it is shown in FIG. 6 that a first source electrode SE1 and a first drain electrode DE1 are formed in the first region A1, and a second source electrode SE2 and a second drain electrode DE2 are formed in the second region A2.

The first source electrode SE1, the first drain electrode DE1, the second source electrode SE2, and the second drain electrode DE2 may include Mo, Al, Cu, Ti, and/or the like and may include a single layer or a multi-layer including the above materials. In an embodiment, the first source electrode SE1, the first drain electrode DE1, the second source electrode SE2, and the second drain electrode DE2 may include a multi-layer of Ti/Al/Ti.

Figure 7:
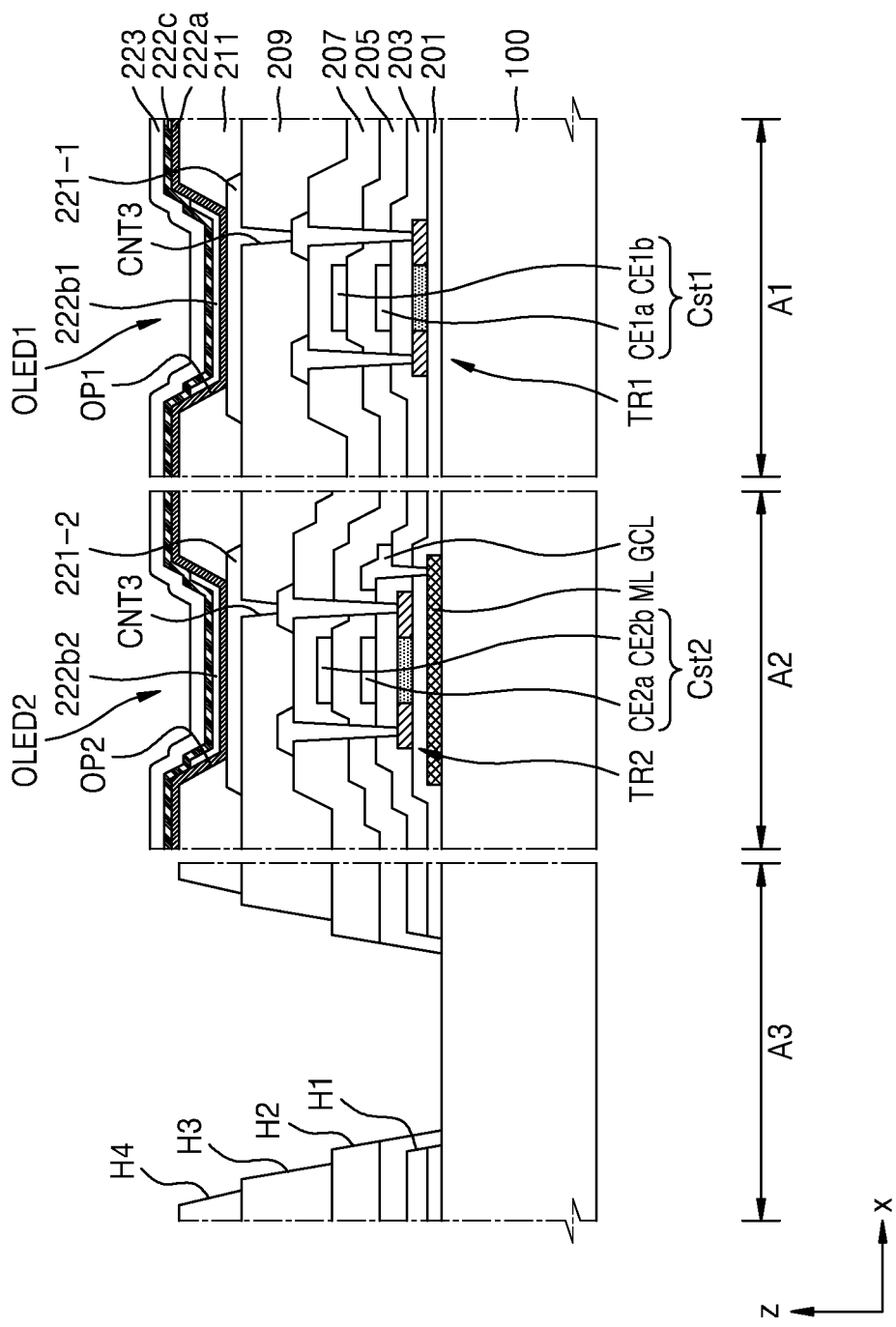
FIG. 7 is a cross-sectional view of one process of manufacturing a display panel, according to an example embodiment.

Referring to FIG. 7, a planarization layer 209 is formed. The planarization layer 209 may cover a first transistor TR1 and the first storage capacitor Cst1 in the first region A1, and a second transistor TR2 and the second storage capacitor Cst2 in the second region A2. The planarization layer 209 may include an organic insulating material. The organic insulating material may include a general-purpose polymer, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the planarization layer 209 may include polyimide.

Then, a third contact hole (i.e., a third contact opening) CNT3 is formed in the planarization layer 209. The third contact hole CNT3 may be formed in each of the first region A1 and the second region A2. The planarization layer 209 may include a third hole (i.e., a third opening) H3 located in the third region A3. The third hole H3 may be formed during the same process as a process of forming the third contact hole CNT3 or a separate process. The third hole H3 overlaps the first hole H1 and the second hole H2.

Next, a first pixel electrode 221-1 and a second pixel electrode 221-2 are respectively formed in the first region A1 and the second region A2. The first pixel electrode 221-1 may be electrically connected to the first transistor TR1 through the third contact hole CNT3, and the second pixel electrode 221-2 may be electrically connected to the second transistor TR2 through the third contact hole CNT3.

The first pixel electrode 221-1 and the second pixel electrode 221-2 may include a conductive oxide such as indium tin oxide (ITO), zinc oxide (IZO), zinc oxide (ZnO), indium oxide ($In_2O_3$), indium gallium oxide (IGO), aluminum zinc oxide (AZO), or the like. In another embodiment, the first pixel electrode 221-1 and the second pixel electrode 221-2 may include a reflective layer including Ag, Mg, Al, Pt, Pd, Au, Ni, Nd, Ir, Cr, or a compound thereof. In another embodiment, the first pixel electrode 221-1 and the second pixel electrode 221-2 may further include a layer including ITO, IZO, ZnO, $In_2O_3$, and/or the like on/under the reflective layer.

A pixel-defining layer 211 is formed on the first pixel electrode 221-1 and the second pixel electrode 221-2. The pixel-defining layer 211 may cover edges of each of the first pixel electrode 221-1 and the second pixel electrode 221-2 in the first region A1 and the second region A2. The pixel-defining layer 211 may include an organic insulating material and/or an inorganic insulating material. The pixel-defining layer 211 includes a first opening OP1 and a second opening OP2 that respectively overlap the first pixel electrode 221-1 and the second pixel electrode 221-2.

The pixel-defining layer 211 may include a fourth hole (i.e., a fourth opening) H4 located in the third region A3. The fourth hole H4 may be formed during the same process as a process of forming the first opening OP1 and the second opening OP2. In some examples, the fourth hole H4 may be formed during a different process.

A first functional layer 222a is formed over the substrate 100 over which the pixel-defining layer 211 is formed. The first functional layer 222a may include a single layer or a multi-layer. The first functional layer 222a may include a hole transport layer (HTL), which has a single-layered structure. In some examples, the first functional layer 222a may include a hole injection layer (HIL) and a hole transport layer (HTL). The first functional layer 222a may be provided as one body so as to cover the first region A1 and the second region A2.

Then, a first emission layer 222b1 is formed in the first region A1, and a second emission layer 222b2 is formed in the second region A2. The first emission layer 222b1 and the second emission layer 222b2 may include a polymer material or a low molecular weight material and emit red, green, blue, or white light. The first emission layer 222b1 and the second emission layer 222b2 may be patterned to respectively overlap the first pixel electrode 221-1 and the second pixel electrode 221-2.

Next, a second functional layer 222c may be formed. In an embodiment, the second functional layer 222c may be omitted. For example, in the case where the first functional layer 222a and the emission layer 222b include a polymer material, it may be preferable that the second functional layer 222c is formed. The second functional layer 222c may include a single layer or a multi-layer. The second functional layer 222c may include an electron transport layer (ETL) and/or an electron injection layer (EIL). The second functional layer 222c may be formed as one body so as to cover the first region A1 and the second region A2.

Then, an opposite electrode 223 is formed. The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. In some examples, the opposite electrode 223 may further include a layer including ITO, IZO, ZnO, $In_2O_3$, or the like on the (semi) transparent layer including the above material. The opposite electrode 223 may be formed as one body so as to cover the first region A1 and the second region A2.

Layers from the first pixel electrode 221-1 to the opposite electrode 223 formed in the first region A1 may constitute a first organic light-emitting diode OLED1. Layers from the second pixel electrode 221-2 to the opposite electrode 223 formed in the second region A2 may constitute a second organic light-emitting diode OLED2.

Figure 8:
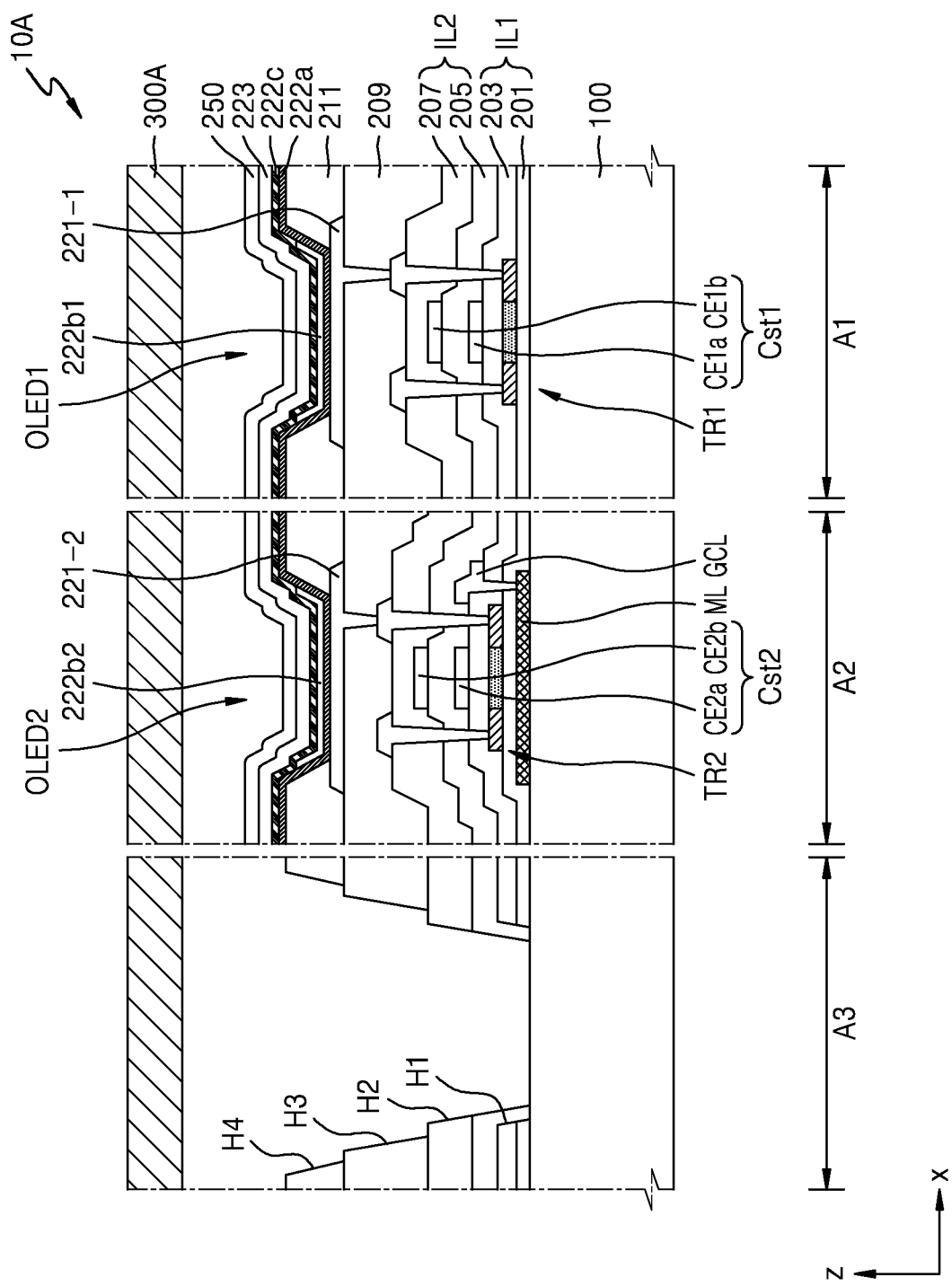
FIG. 8 is a cross-sectional view of one process of manufacturing a display panel, according to an example embodiment.

Referring to FIG. 8, the first organic light-emitting diode OLED1 and the second organic light-emitting diode OLED2 may be covered by an encapsulation substrate 300A. The encapsulation substrate 300A may include a transparent material. For example, the encapsulation substrate 300A may include a glass material. In some examples, the encapsulation substrate 300A may include a polymer resin. The encapsulation substrate 300A may prevent or substantially prevent external moisture or foreign substance from penetrating into the first organic light-emitting diode OLED1 and the second organic light-emitting diode OLED2.

A sealing material such as sealant may be arranged between the encapsulation substrate 300A and the substrate 100 over which the first organic light-emitting diode OLED1 and the second organic light-emitting diode OLED2 are formed. The sealing material may block external moisture or foreign substances that may penetrate through a space between the substrate 100 and the encapsulation substrate 300A.

Before the encapsulation substrate 300A is arranged, a capping layer 250 may be formed on the opposite electrode 223. The capping layer 250 may include LiF. In some examples, the capping layer 250 may include an inorganic insulating material such as silicon nitride and/or an organic insulating material. In some examples, the capping layer 250 may be omitted.

A display panel 10A described with reference to FIGS. 1 to 8 may display an image (e.g., a predetermined image) through the first organic light-emitting diode OLED1 arranged in the first region A1 and the second organic light-emitting diode OLED2 arranged in the second region A2. The third region A3 may include a kind of transmission area that may transmit light. For example, in FIG. 8, light produced from below the substrate 100 may progress in a z-direction through the third region A3, and light produced from above the encapsulation substrate 300A may progress in a (−) z direction through the third region A3.

Figure 9:
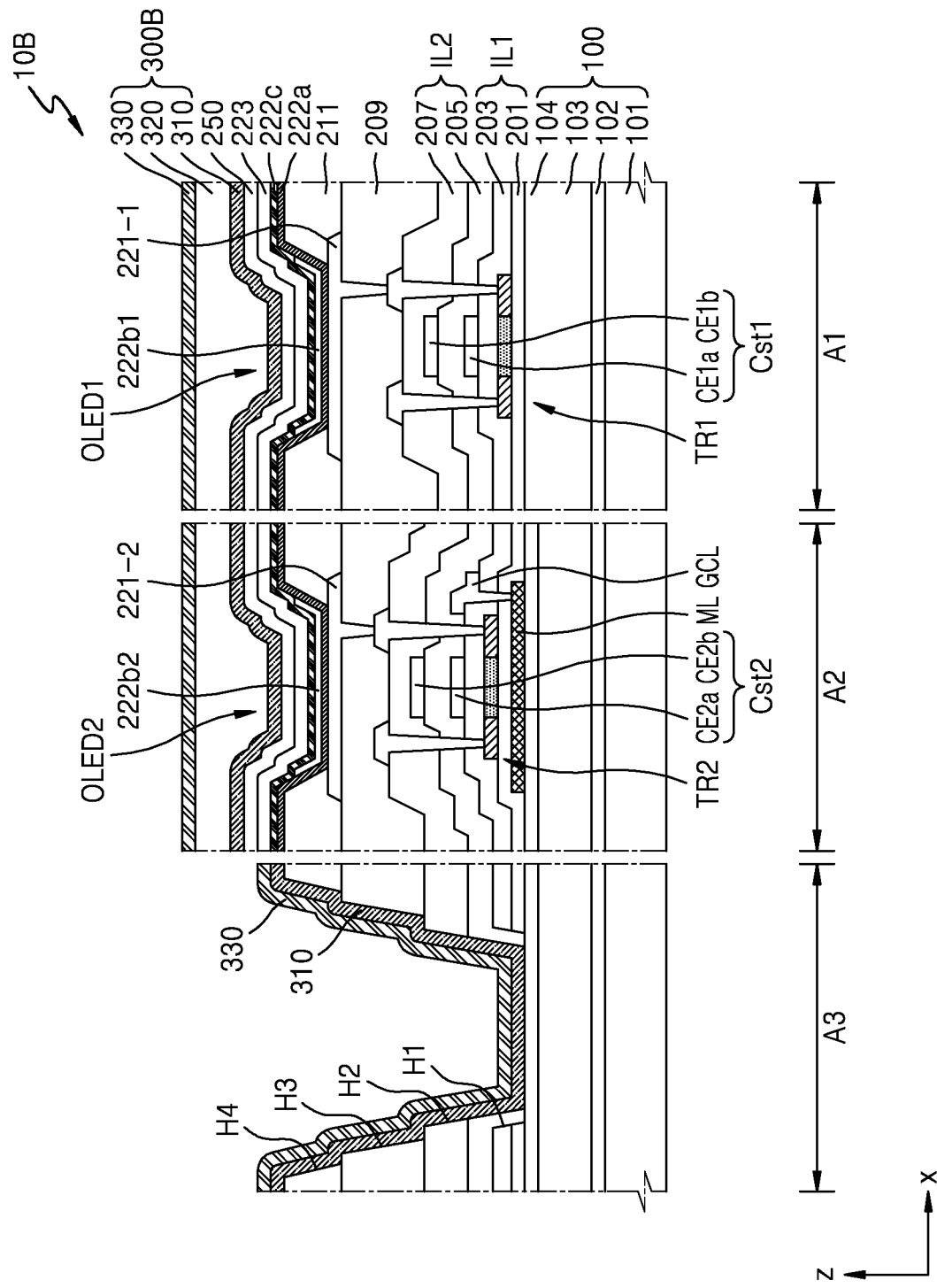
FIG. 9 is a cross-sectional view of a display panel according to another example embodiment.

FIG. 9 is a cross-sectional view of a display panel according to another embodiment. Though it is shown in FIG. 8 that the display panel 10A may include the encapsulation substrate 300A as an encapsulation member, a display panel 10B may include a thin-film encapsulation layer 300B as an encapsulation member in another embodiment as shown in FIG. 9.

FIG. 9 shows a process after the process described with reference to FIG. 7 and shows a state in which the capping layer 250 is formed. Referring to FIG. 9, the thin-film encapsulation layer 300B is formed on the capping layer 250. The thin-film encapsulation layer 300B may include at least one inorganic encapsulation layer and at least one organic encapsulation layer. With regard to this, it is shown in FIG. 9 that the thin-film encapsulation layer 300B has a structure in which a first inorganic encapsulation layer 310, an organic encapsulation layer 320, and a second inorganic encapsulation layer 330 are stacked. In another embodiment, the number of organic encapsulation layers, the number of inorganic encapsulation layers, and a stacking sequence may be modified.

The first inorganic encapsulation layer 310 and the second inorganic encapsulation layer 330 may include at least one of inorganic insulating materials such as aluminum oxide, titanium oxide, tantalum oxide, hafnium oxide, zinc oxide, silicon oxide, silicon nitride, silicon oxynitride, and/or the like and may be formed by chemical vapor deposition (CVD). The organic encapsulation layer 320 may include a polymer-based material. The polymer-based material may include a silicon-based resin, an acrylic-based resin, an epoxy-based resin, polyimide, polyethylene, and/or the like.

The first inorganic encapsulation layer 310 and the second inorganic encapsulation layer 330 may be formed as one body so as to cover the first region A1, the second region A2, and the third region A3. The organic encapsulation layer 320 may be formed as one body so as to cover the first region A1 and the second region A2. There may be no organic encapsulation layer 320 in the third region A3. In other words, the organic encapsulation layer 320 may include an opening corresponding to the third region A3. The first inorganic encapsulation layer 310 and the second inorganic encapsulation layer 330 may contact each other in the third region A3. The first inorganic encapsulation layer 310 may contact a top surface of the substrate 100.

The substrate 100 may include a multi-layer. For example, the substrate 100 may include a first base layer 101, a first barrier layer 102, a second base layer 103, and a second barrier layer 104.

Each of the first base layer 101 and the second base layer 103 may include a polymer resin. For example, each of the first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), and the like. The polymer resin may be transparent.

Each of the first barrier layer 102 and the second barrier layer 104 is a barrier layer preventing or substantially preventing penetration of external foreign substances and may include a single layer or a multi-layer including an inorganic insulating material such as silicon nitride ($SiN_x$, x>0), and silicon oxide ($SiO_x$, x>0). In the case where the substrate 100 includes a polymer resin, the flexibility of the substrate 100 may be relatively improved (e.g., increased) compared to the case where the substrate 100 includes a glass material.

Figure 10:
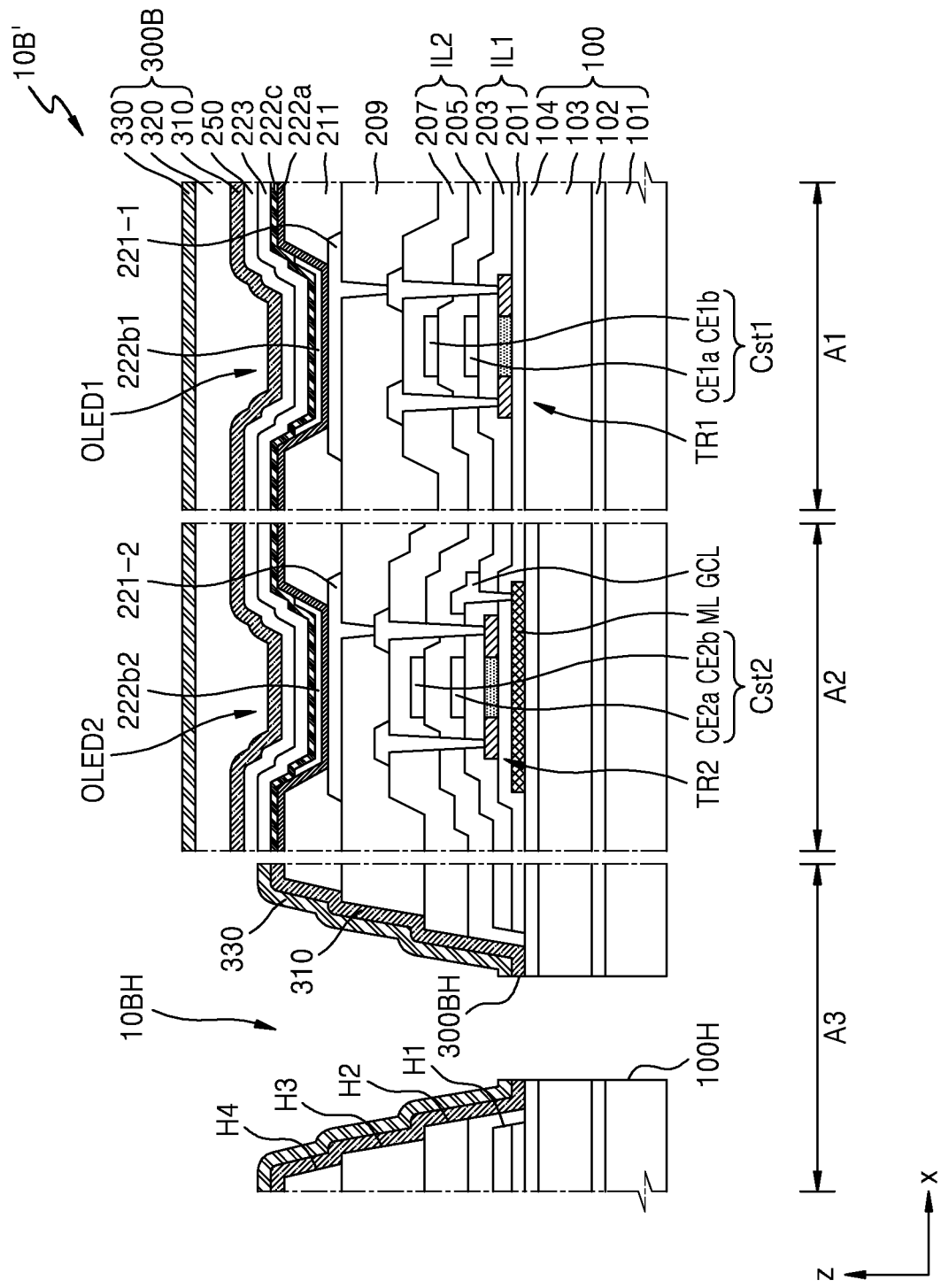
FIG. 10 is a cross-sectional view of a display panel according to another example embodiment.

FIG. 10 is a cross-sectional view of a display panel 10B' according to another embodiment. As described with reference to FIG. 9, unlike a substrate including a glass material, in the substrate 100 including a polymer resin, it may be easy to form a hole passing through the substrate 100.

Referring to FIG. 10, as described with reference to FIG. 9, after the thin-film encapsulation layer 300B is formed, a hole 100H passing through the substrate 100 may be formed. The hole 100H may be formed by a process such as a laser, scribing, and polishing. During a process of forming the hole 100H, a hole 300BH may be formed also in the thin-film encapsulation layer 300B, the hole 300BH corresponding to the third region A3. The hole 100H passing through the substrate 100 and the hole 300BH passing through the thin-film encapsulation layer 300B may overlap each other and overlap the first hole H1, the second hole H2, the third hole H3 and/or the fourth hole H4.

Since the display panel 10B' shown in FIG. 10 includes a hole 10BH passing through the third region A3 of the display panel 10B', the display panel 10B' may have a relatively higher transmittance in the third region A3 than the display panel 10B shown in FIG. 9. Light and/or sound may be transmitted through the hole 10BH of the display panel 10B' shown in FIG. 10.

Figure 11:
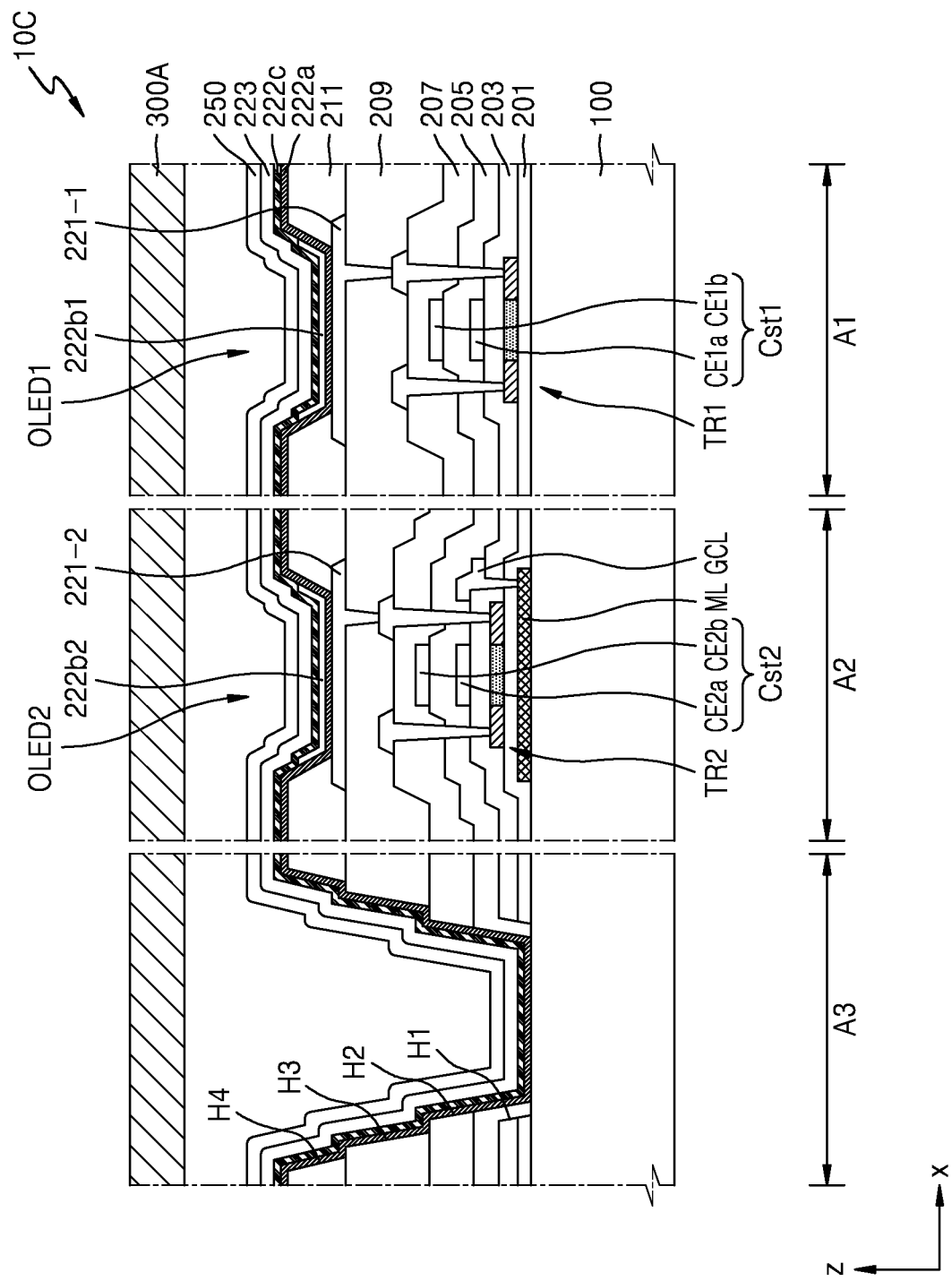
FIG. 11 is a cross-sectional view of a display panel according to another example embodiment.

FIG. 11 is a cross-sectional view of a display panel 10C according to an embodiment. Since structures of the first region A1 and the second region A2 of the display panel 10C in FIG. 11 are the same as those of the first region A1 and the second region A2 of the display panel 10A described with reference to FIGS. 1 to 8, the third region A3 is mainly described below.

Referring to the third region A3 of FIG. 11, at least one of the first functional layer 222a, the second functional layer 222c, the opposite electrode 223, or the capping layer 250 may be located in the third region A3. The transmittance of the third region A3 of the display panel 10C in FIG. 11 may be less than the transmittance of the third region A3 of the display panel 10A described with reference to FIG. 8. In an embodiment, in the case where the third region A3 of the display panel 10A described with reference to FIG. 8 is utilized as a region that transmits light in a visible light wavelength band, the third region A3 of the display panel 10C in FIG. 11 may be utilized as a region that may transmit, for example, light in an infrared wavelength band.

Figure 12:
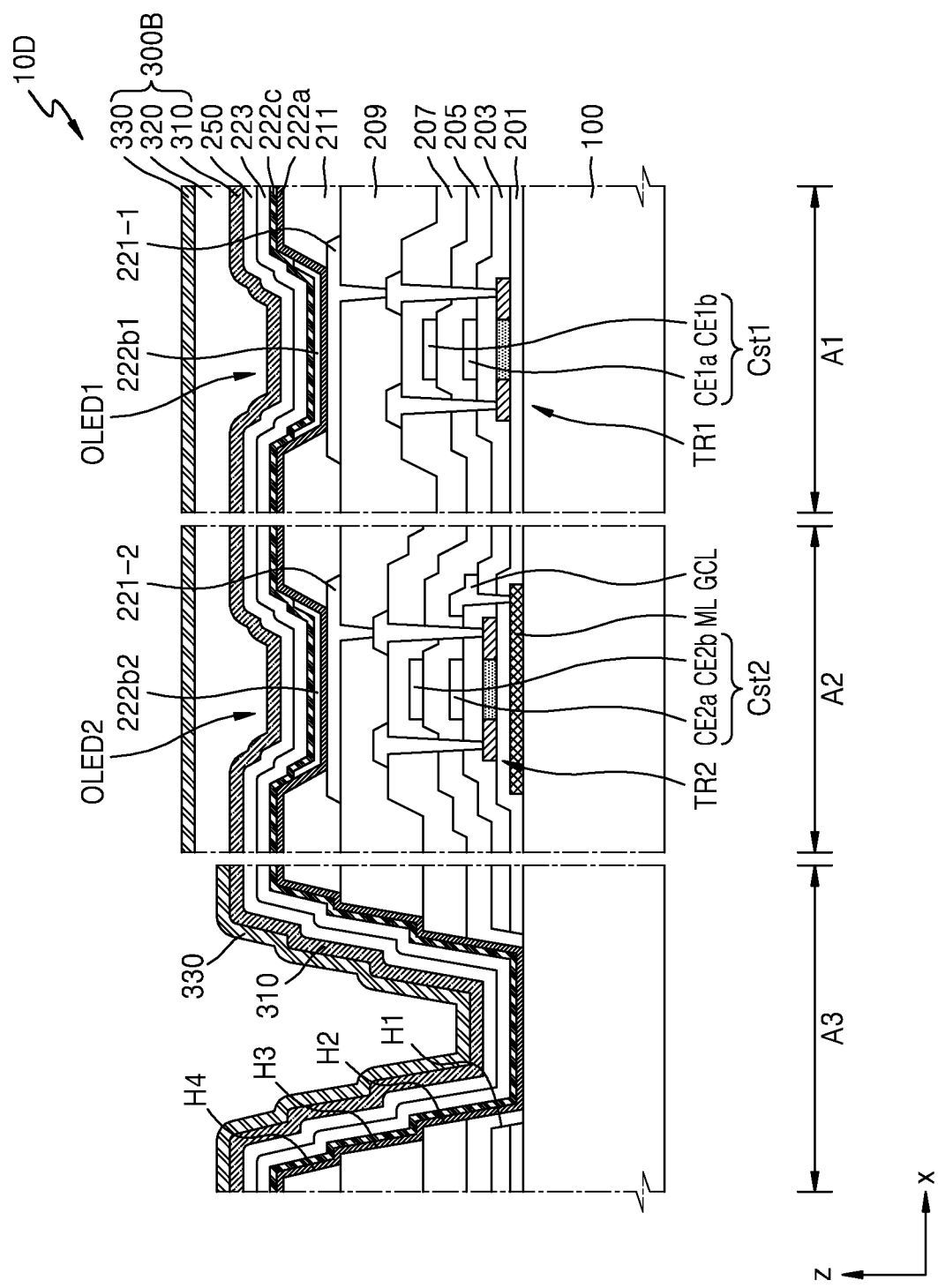
FIG. 12 is a cross-sectional view of a display panel according to another example embodiment.

FIG. 12 is a cross-sectional view of a display panel 10D according to an embodiment. Since structures of the first region A1 and the second region A2 of the display panel 10D in FIG. 12 are the same as those of the first region A1 and the second region A2 of the display panel 10B described with reference to FIG. 9, the third region A3 is mainly described below.

Referring to the third region A3 of FIG. 12, at least one of the first functional layer 222a, the second functional layer 222c, the opposite electrode 223, or the capping layer 250 may be located in the third region A3. Also, the first inorganic encapsulation layer 310 and the second inorganic encapsulation layer 330 may be located in the third region A3. The transmittance of the third region A3 of the display panel 10D in FIG. 12 may be relatively less than the transmittance of the third region A3 of the display panel 10B described with reference to FIG. 9. In an embodiment, the third region A3 of the display panel 10D in FIG. 12 may be utilized as a region that may transmit, for example, light in an infrared wavelength band.

In the display panels 10A, 10B, 10B', 10C, and 10D described with reference to FIGS. 8, 9, 10, 11, and 12, the first hole H1, the second hole H2, etc. are formed so as to improve (e.g., increase) the transmittance of the third region A3. In this case, the first hole H1 may be concurrently (e.g., simultaneously) formed with the first contact hole CNT1 during a process of forming the first contact hole CNT1. The second hole H2 may be concurrently (e.g., simultaneously) formed with the second contact hole CNT2 during a process of forming the second contact hole CNT2. Therefore, since a separate process for improving (e.g., increasing) the transmittance of the third region A3 is not required, manufacturing costs, time, etc. may be reduced.

Though, in the display panels 10A, 10B, 10B', 10C, and 10D described with reference to FIGS. 8, 9, 10, 11, and 12, the first hole H1 and the first contact hole CNT1 are formed to pass through the first insulating layer IL1, and the first insulating layer IL1 includes the buffer layer 201 and the gate insulating layer 203, the present disclosure is not limited thereto. In an embodiment, as described below with reference to FIGS. 14 to 21, the first hole H1 and the first contact hole CNT1 may be formed in the first insulating layer including a greater number of sub-layers than that described with reference to FIG. 8, etc.

Figure 14:
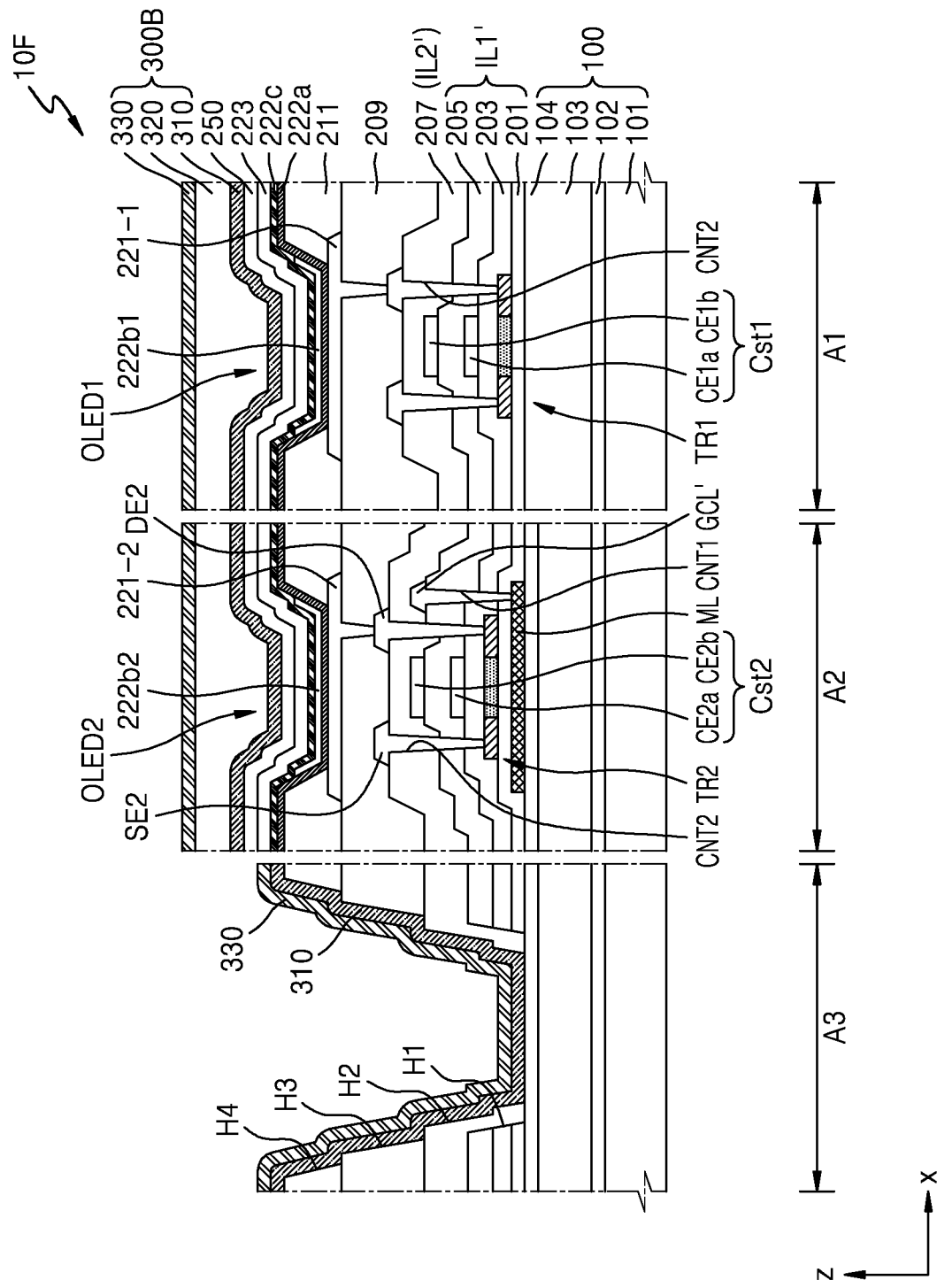
FIG. 14 is a cross-sectional view of a display panel according to another example embodiment.

FIG. 14 is a cross-sectional view of a display panel 10F according to another embodiment.

Referring to FIG. 14, the first hole H1 and the first contact hole CNT1 may be formed to pass through a first insulating layer IL1'. The first insulating layer IL1' may include the buffer layer 201, the gate insulating layer 203, and the first interlayer insulating layer 205.

A wiring GCL' electrically connected to the metal layer ML formed in the second region A2 may be formed during the same process as a process of forming the second electrode layer CE2b. A process of forming the first contact hole CNT1 for connection between the wiring GCL' and the metal layer ML may be performed after the first interlayer insulating layer 205 is formed. The first hole H1 may be concurrently (e.g., simultaneously) formed with the first contact hole CNT1 during a process of forming the first contact hole CNT1.

The first contact hole CNT1 may be defined by lateral surfaces of the first insulating layer IL1' that surround the first contact hole CNT1, and the first hole H1 may be defined by lateral surfaces of the first insulating layer IL1' that surround the first hole H1. Since the first hole H1 and the first contact hole CNT1 are formed to pass through the first insulating layer IL1' during the same process, the number of layers defining the first hole H1 may be the same as the number of layers defining the first contact hole CNT1, and/or a material change of the layers defining the first contact hole CNT1 in a thickness (a depth) direction may have the same pattern as that of a material change of the layers defining the first hole H1 in a thickness (a depth) direction. Likewise, a material change of a lateral surface of the first contact hole CNT1 in a depth (a thickness) direction of the first contact hole CNT1 may be the same as a material change of a lateral surface of the first hole H1 in a depth (a thickness) direction of the first hole H1.

The wiring GLC' may apply a voltage (e.g., a predetermined voltage), for example, a constant voltage (e.g., ELVDD, see FIG. 21), to the metal layer ML. As a comparative example, in the case where a wiring is in a floated state, external static electricity may be introduced through the wring in a floated state and thus may damage the second transistor TR2. In the present embodiment, to prevent or substantially prevent the introduction of the external static electricity, a constant voltage may be applied to the metal layer ML.

The second hole H2 may be concurrently (e.g., simultaneously) formed with the second contact hole CNT2 during a process of forming the second contact hole CNT2. The second hole H2 may be formed in a second insulating layer IL2'. The second insulating layer IL2' may include the second interlayer insulating layer 207 located between the wiring GCL' and the second drain electrode DE2 and/or between the wiring GCL' and the second source electrode SE2. That is, the number of layers defining the second hole H2 may be the same as the number of layers located between the wiring GCL' and the second drain electrode DE2 and/or between the wiring GCL' and the second source electrode SE2. In an embodiment, in the case where the second interlayer insulating layer 207 includes a double layer of a silicon oxide layer and a silicon nitride layer, the number of layers defining the second hole H2 may be two. In this case, the number of layers located between the wiring GCL' and the second drain electrode DE2 and/or between the wiring GCL' and the second source electrode SE2 is two. In another embodiment, in the case where the second interlayer insulating layer 207 includes a single layer of a silicon nitride layer, the number of layers defining the second hole H2 may be one, and the number of layers located between the wiring GCL' and the second drain electrode DE2 and/or between the wiring GCL' and the second source electrode SE2 is one.

Figure 13:
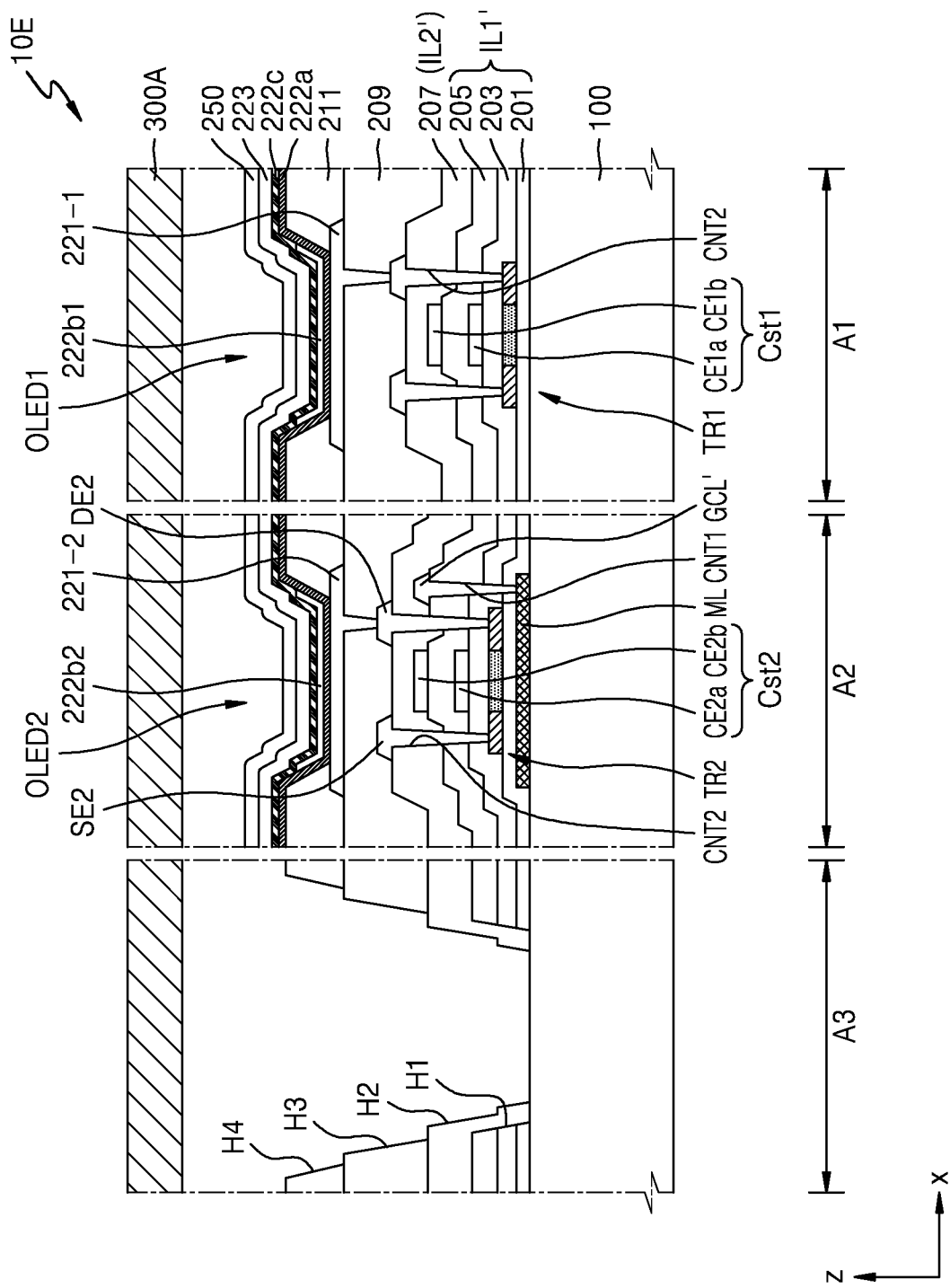
FIG. 13 is a cross-sectional view of a display panel according to another example embodiment.

Though it is shown in FIG. 13 that a width of the first hole H1 is greater than a width of the second hole H2, the embodiment is not limited thereto. In another embodiment, as described with reference to FIG. 5B, the width of the first hole H1 may be less than the width of the second hole H2. In some examples, the width of the first hole H1 may be the same as the width of the second hole H2.

Other elements excluding the characteristics described with reference to FIG. 13 are the same as those of the embodiment described with reference to FIG. 8.

Figure 15:
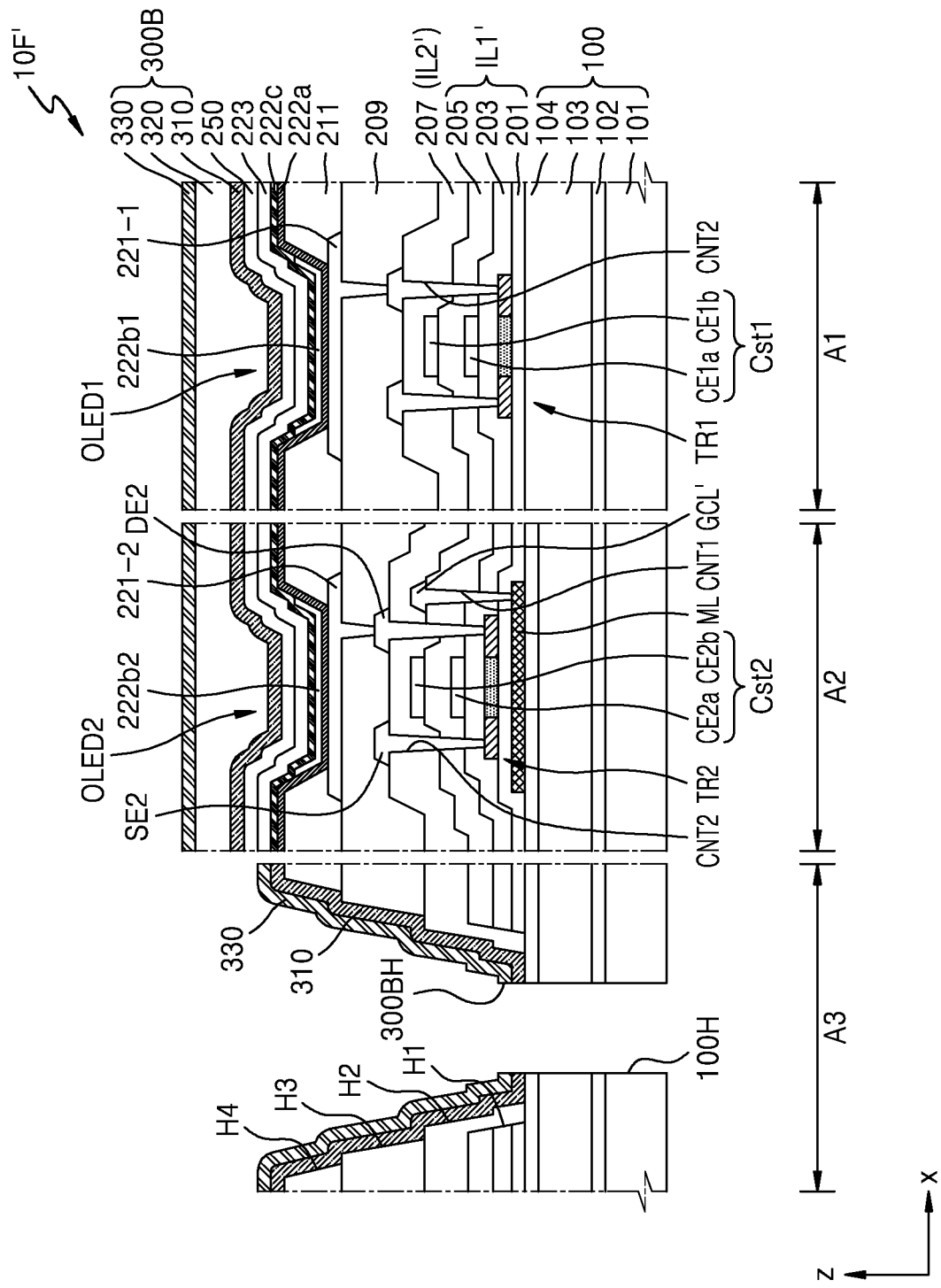
FIG. 15 is a cross-sectional view of a display panel according to another example embodiment.

FIGS. 14 and 15 are cross-sectional views of display panels 10F and 10F' according to another embodiment.

In the display panels 10F and 10F' shown in FIGS. 14 and 15, as described with reference to FIG. 13, the first hole H1 and the first contact hole CNT1 may be formed to pass through the first insulating layer IL1' including the buffer layer 201, the gate insulating layer 203, and the first interlayer insulating layer 205. The second hole H2 may be formed to pass through the second insulating layer IL2' including the second interlayer insulating layer 207.

Unlike the display panel 10E shown in FIG. 13, in the display panels 10F and 10F' shown in FIGS. 14 and 15, the first organic light-emitting diode OLED1 and the second organic light-emitting diode OLED2 may be covered by the thin-film encapsulation layer 300B. Also, the substrate 100 may include the first base layer 101, the first barrier layer 102, the second base layer 103, and the second barrier layer 104. Specific configurations of the thin-film encapsulation layer 300B and the substrate 100 are the same as those described with reference to FIG. 9, etc.

Unlike the display panel 10F of FIG. 14, the display panel 10F' of FIG. 15 may include the hole 100H passing through the substrate 100 and the hole 300BH passing through the thin-film encapsulation layer 300B in the third region A3.

Figure 16:
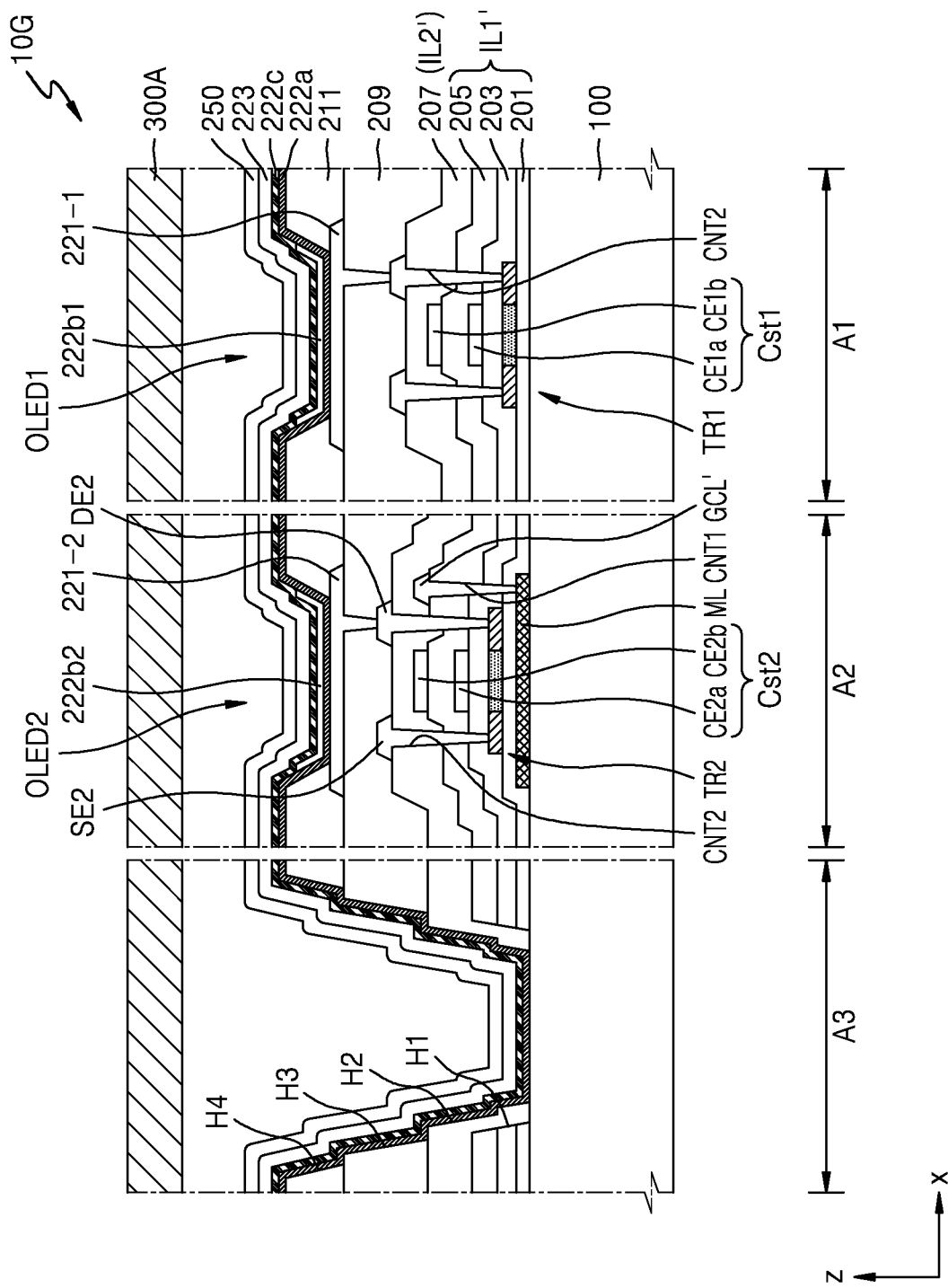
FIG. 16 is a cross-sectional view of a display panel according to another example embodiment.

FIG. 16 is a cross-sectional view of a display panel 10G according to another embodiment.

In the display panel 10G shown in FIG. 16, as described with reference to FIG. 13, the first hole H1 and the first contact hole CNT1 may be formed to pass through the first insulating layer IL1' including the buffer layer 201, the gate insulating layer 203, and the first interlayer insulating layer 205. The second hole H2 may be formed to pass through the second insulating layer IL2' including the second interlayer insulating layer 207.

Referring to the third region A3 of the display panel 10G of FIG. 16, at least one of the first functional layer 222a, the second functional layer 222c, the opposite electrode 223, or the capping layer 250 may be located in the third region A3, and a specific configuration thereof is the same as that described with reference to FIG. 11.

Figure 17:
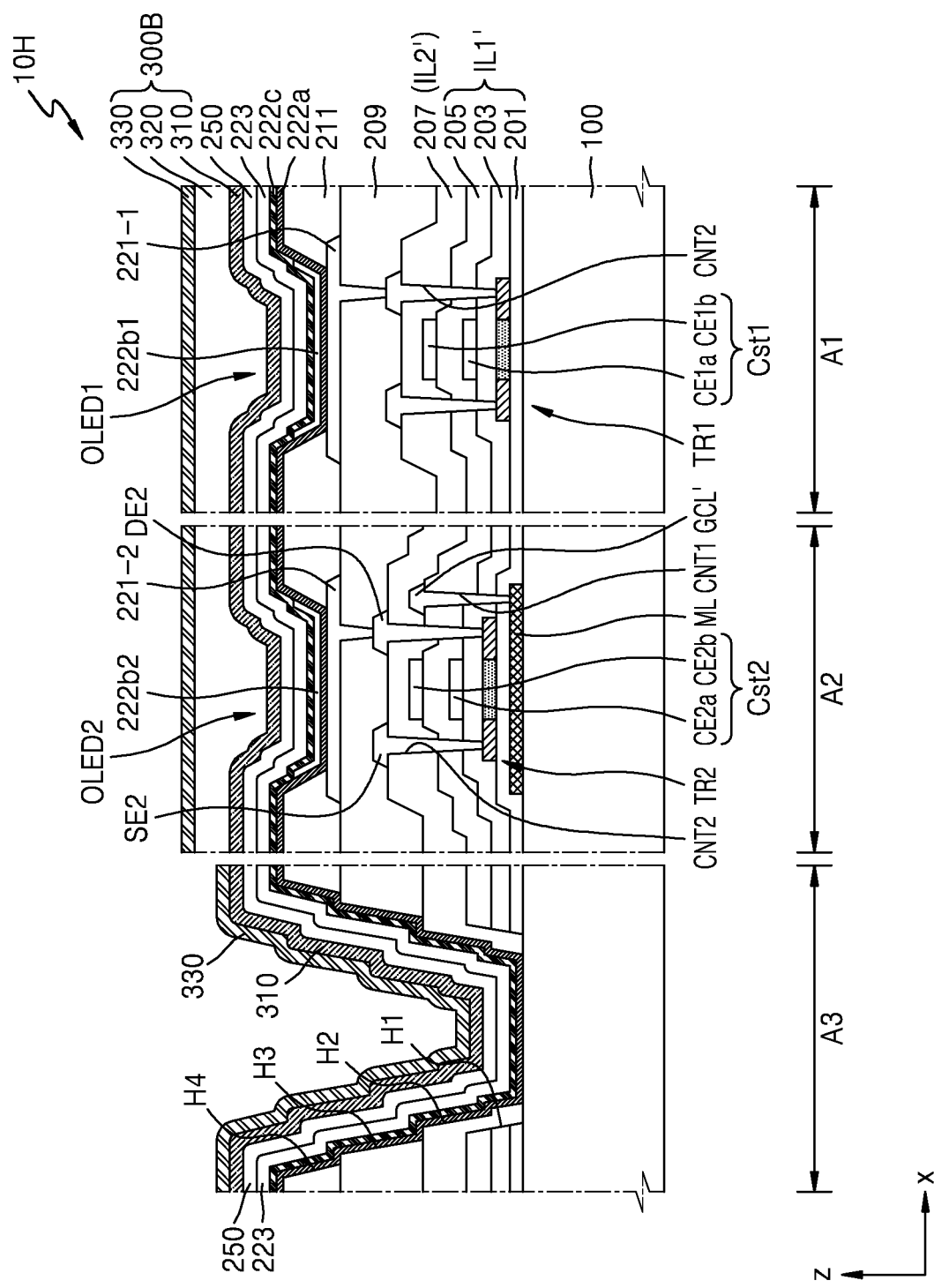
FIG. 17 is a cross-sectional view of a display panel according to another example embodiment.

FIG. 17 is a cross-sectional view of a display panel 10H according to another embodiment.

In the display panel 10H shown in FIG. 17, as described with reference to FIG. 13, the first hole H1 and the first contact hole CNT1 may be formed to pass through the first insulating layer IL1' including the buffer layer 201, the gate insulating layer 203, and the first interlayer insulating layer 205. The second hole H2 may be formed to pass through the second insulating layer IL2' including the second interlayer insulating layer 207.

Referring to the third region A3 of the display panel 10H of FIG. 17, at least one of the first functional layer 222a, the second functional layer 222c, the opposite electrode 223, or the capping layer 250 may be located in the third region A3. Also, the first inorganic encapsulation layer 310 and the second inorganic encapsulation layer 330 may be located in the third region A3, and a specific structure including the above-described configuration is the same as that described with reference to FIG. 12.

Figure 18:
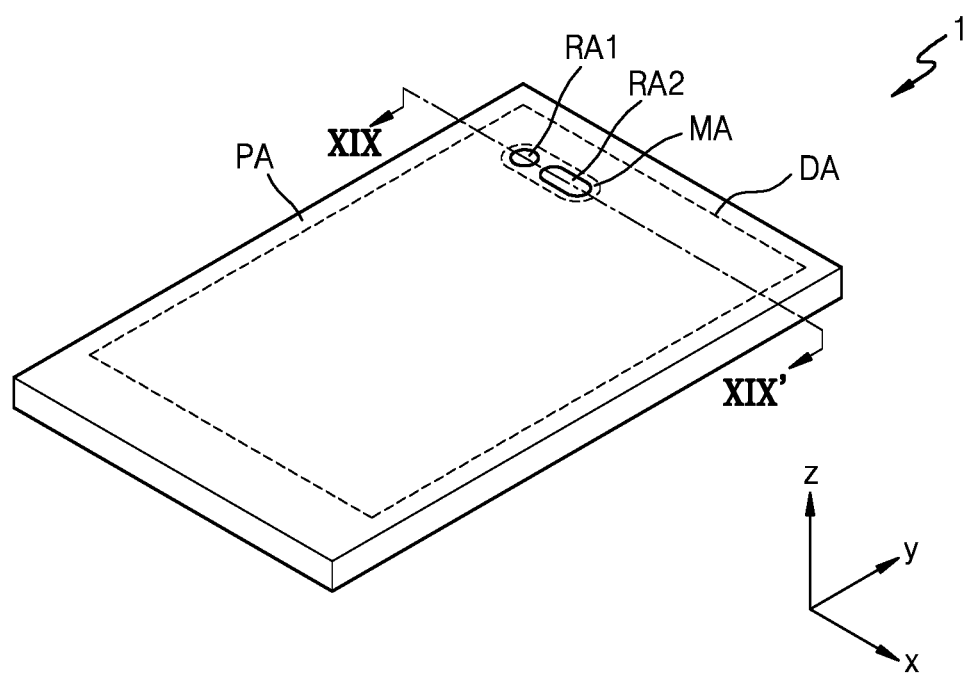
FIG. 18 is a perspective view of a display device according to an example embodiment.

FIG. 18 is a perspective view of a display device 1 according to an embodiment.

Referring to FIG. 18, the display device 1 includes a display area DA surrounding a first component area RA1 and a second component area RA2. The first component area RA1 and the second component area RA2 may have different sizes (areas) and/or different shapes. In some examples, the first component area RA1 and the second component area RA2 may have the same size (area) and/or the same shape.

The display area DA may display an image (e.g., a predetermined image) by using light emitted from a plurality of pixels arranged in the display area DA. An intermediate area MA may be arranged between the first component area RA1 and the second component area RA2, and the display area DA. The display area DA may be surrounded by a peripheral area PA. The intermediate area MA and the peripheral area PA may be a kind of non-display area in which pixels are not arranged. The intermediate area MA may be entirely surrounded by the display area DA, which may be entirely surrounded by the peripheral area PA.

Hereinafter, though the display device 1 according to an embodiment is described by using an organic light-emitting display device as an example, the display device 1 of the present disclosure is not limited thereto. In another embodiment, various types of display devices such as an inorganic light-emitting display and a quantum dot light-emitting display may be used.

Figure 19:
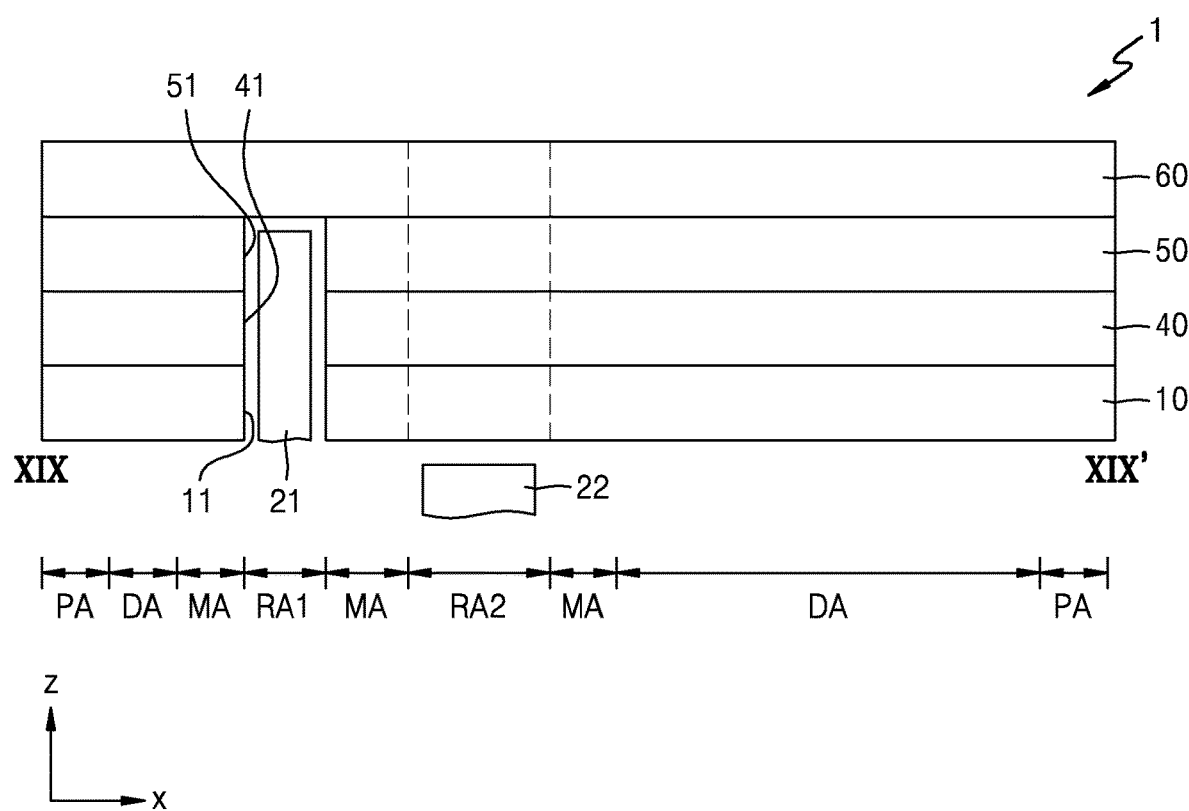
FIG. 19 is a cross-sectional view of a display device according to an example embodiment.

FIG. 19 is a cross-sectional view of the display device 1 according to an embodiment. FIG. 19 may correspond to a cross-section taken along line XIX-XIX' of FIG. 18.

Referring to FIG. 19, the display device 1 may include a display panel 10, an input sensing layer 40, and an optical functional layer 50 arranged on the display panel 10. These may be covered by a window 60. The display device 1 may include various suitable electronic devices such as mobile phones, notebook computers, and smartwatches.

The display panel 10 may display an image. The display panel 10 includes pixels arranged in the display area DA. Each of the pixels may include a display element and a pixel circuit connected thereto. The display element may include an organic light-emitting diode. In some examples, the display element may include an inorganic light-emitting diode or a quantum dot light-emitting diode.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input using a mutual cap method and/or a self-cap method.

The input sensing layer 40 may be directly formed on the display panel 10 or may be formed separately and then coupled to the display panel 10 by using an adhesive layer such as an optical clear adhesive. For example, the input sensing layer 40 may be successively formed after a process of forming the display panel 10. In this case, the adhesive layer may not be arranged between the input sensing layer 40 and the display panel 10. Though FIG. 19 shows that the input sensing layer 40 is arranged between the display panel 10 and the optical functional layer 50, the input sensing layer 40 may be arranged on the optical functional layer 50 in another embodiment.

The optical functional layer 50 may include a reflection prevention layer. The reflection prevention layer may reduce reflectivity of light (external light) incident from the outside toward the display panel 10 through the window 60. The reflection prevention layer may include a retarder and a polarizer. The retarder may include a film-type retarder or a liquid crystal-type retarder. The retarder may include a $\lambda/2$ (a half-wavelength) retarder and/or a $\lambda/4$ (a quarter-wavelength) retarder. The polarizer may include a film-type polarizer or a liquid crystal-type polarizer. The film-type polarizer may include a stretchable synthetic resin film, and the liquid crystal-type polarizer may include liquid crystals arranged in a set or predetermined arrangement. Each of the retarder and the polarizer may further include a protective film. The retarder and the polarizer itself or a protective film may be defined as a base layer of the reflection prevention layer.

In another embodiment, the reflection prevention layer may include a black matrix and color filters. The color filters may be arranged by taking into account colors of lights emitted respectively from pixels of the display panel 10. In another embodiment, the reflection prevention layer may include a destructive interference structure. The destructive interference structure may include a first reflection layer and a second reflection layer respectively arranged on different layers. First-reflected light and second-reflected light respectively reflected by the first reflection layer and the second reflection layer may create destructive interference and thus the reflectivity of external light may be reduced.

The optical functional layer 50 may include a lens layer. The lens layer may improve (e.g., increase) the emission efficiency of light emitted from the display panel 10 or reduce the color deviation of light. The lens layer may include a layer having a concave or convex lens shape and/or include a plurality of layers respectively having different refractive indexes. The optical functional layer 50 may include both the reflection prevention layer and the lens layer or include one of the reflection prevention layer and the lens layer.

Each of the display panel 10, the input sensing layer 40, and the optical functional layer 50 may include an opening corresponding to one of the first component area RA1 and the second component area RA2. With regard to this, it is shown in FIG. 19 that the display panel 10, the input sensing layer 40, and the optical functional layer 50 respectively include a first component opening 11, a second component opening 41, and a third component opening 51, and the first component opening 11, the second component opening 41, and the third component opening 51 overlap one another in the first component area RA1. Sizes (e.g., diameters) of the first component opening 11, the second component opening 41, and the third component opening 51 may be the same as or different from one another. In another embodiment, at least one of the display panel 10, the input sensing layer 40, or the optical functional layer 50 may not include an opening.

A component for adding various functions to the display device 1 may be located in the first component area RA1 and the second component area RA2. Each of the first component area RA1 and the second component area RA2 may correspond to a sensor area, a camera area, or a speaker area depending on a kind of a component.

A first component 21 arranged in the first component area RA1 may be located inside the first to third component openings 11, 41, and 51 as shown in FIG. 19. In some examples, like a second component 22, the first component 21 may be arranged below the display panel 10.

The first component 21 and/or the second component 22 may include an electronic element. For example, the first component 21 and/or the second component 22 may include an electronic element that uses light or sound. For example, an electronic element may be a sensor such as an infrared sensor that emits and/or receives light in an infrared wavelength band, a camera that receives light and captures an image, a sensor that outputs and senses light or sound to measure a distance, or a sensor that recognizes a fingerprint, a small lamp that outputs light, or a speaker that outputs sound. An electronic element that uses light may use light in various suitable wavelength bands such as visible light, infrared light, and ultraviolet light. In an embodiment, the first component area RA1 and/or the second component area RA2 may be understood as a transmission area through which light and/or sound, which propagate from an electronic element toward the outside or propagate toward the electronic element from the outside, may pass.

In an embodiment, in the case where the display device 1 is used as a smartwatch or an instrument panel for an automobile, the first component 21 may be a member including a needle of a clock or a needle, etc. indicating predetermined information (e.g. the velocity of a vehicle, etc.). In the case where the display device 1 includes a needle of a clock or an instrument panel for an automobile, the needle may be exposed to the outside through the window 60, which may include an opening. In some examples, even in the case where the first component 21 includes a speaker, the window 60 may include an opening.

As described above, the first component 21 and the second component 22 may include element(s) related to a function of the display device 1 or an element such as an accessory that increases an esthetic sense of the display device 1. A layer including an optical clear adhesive, etc. may be located between the window 60 and the optical functional layer 50.

Figure 20:
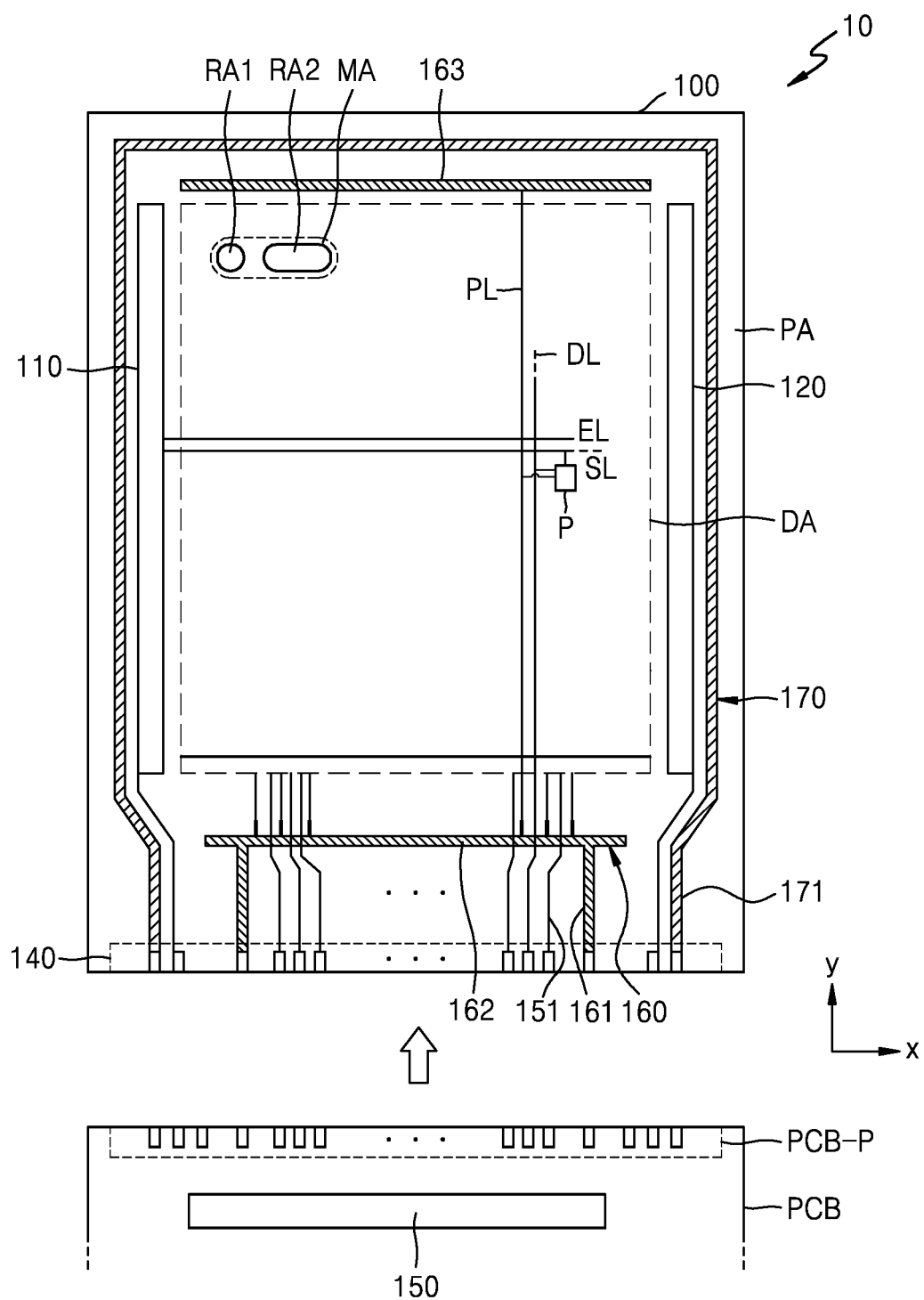
FIG. 20 is a plan view of a display panel according to an example embodiment.

FIG. 20 is a plan view of the display panel 10 according to an embodiment.

Referring to FIG. 20, the display panel 10 may include the first component area RA1, the second component area RA2, the display area DA, the intermediate area MA, and the peripheral area PA. FIG. 20 may be a figure of the substrate 100 of the display panel 10. For example, it may be understood that the substrate 100 includes the first component area RA1, the second component area RA2, the display area DA, the intermediate area MA, and the peripheral area PA.

The display panel 10 includes a plurality of pixels P arranged in the display area DA. Each pixel P may include a display element such as an organic light-emitting diode. Each pixel P may emit, for example, red, green, blue, or white light through an organic light-emitting diode. In the present specification, as described above, it may be understood that a pixel P is a pixel that emits one of red, green, blue, and white lights. The first component area RA1 and the second component area RA2 are arranged inside the display area DA, and the intermediate area MA is located between the first component area RA1 and the second component area RA2, and the display area DA.

The intermediate area MA may surround the first component area RA1 and the second component area RA2. The peripheral area PA may surround the display area DA. The intermediate area MA and the peripheral area PA are a kind of non-display area in which a display element such as an organic light-emitting diode that emits light is not arranged. Trace lines and/or power lines providing a signal to the pixels P may be arranged in the intermediate area MA and the peripheral area PA.

A first outer driving circuit 110, a second outer driving circuit 120, a terminal 140, a data driving circuit 150, a first power supply line 160, and a second power supply line 170 may be arranged in the peripheral area PA.

The first outer driving circuit 110 may include scan and control driving circuits. The first outer driving circuit 110 may provide a scan signal and an emission control signal to the pixels P through a scan line SL and an emission control line EL. The second outer driving circuit 120 may be arranged in parallel to the first outer driving circuit 110 with the display area DA therebetween. The second outer driving circuit 120 may also include scan and control driving circuits. In another embodiment, the second outer driving circuit 120 may be omitted.

The terminal 140 may be arranged on one side of the peripheral area PA. The terminal 140 may not be covered by an insulating layer and be exposed and thus electrically connected to a printed circuit board PCB. A terminal PCB-P of the printed circuit board PCB may be electrically connected to the terminal 140 of the display panel 10. The printed circuit board PCB transfers a signal of a controller or power to the display panel 10. A control signal generated by the controller may be transferred to the first outer driving circuit 110 and the second outer driving circuit 120 through the printed circuit board PCB. The controller may respectively provide first power ELVDD (also referred to as a first power voltage) and second power ELVSS (also referred to as a second power voltage, see FIG. 21) to the first power supply line 160 and the second power supply line 170 through a first connection line 161 and a second connection line 171. The first power ELVDD may be provided to each pixel P through the driving voltage line PL connected to the first power supply line 160, and the second power ELVSS may be provided to an opposite electrode of a pixel P connected to the second power supply line 170.

The data driving circuit 150 is electrically connected to a data line DL. A data signal of the data driving circuit 150 may be provided to each pixel P through a connection line 151 and a data line DL, the connection line 151 being connected to the terminal 140 and the data line DL being connected to the connection line 151. Though it is shown in FIG. 20 that the data driving circuit 150 is arranged on the printed circuit board PCB, the data driving circuit 150 may be arranged on the substrate 100 in another embodiment. For example, the data driving circuit 150 may be arranged between the terminal 140 and the first power supply line 160.

The first power supply line 160 may include a first sub-line 162 and a second sub-line 163 extending in parallel to an x-direction with the display area DA therebetween. The second power supply line 170 may have a loop shape having one open side and partially surrounding the display area DA.

Figure 21:
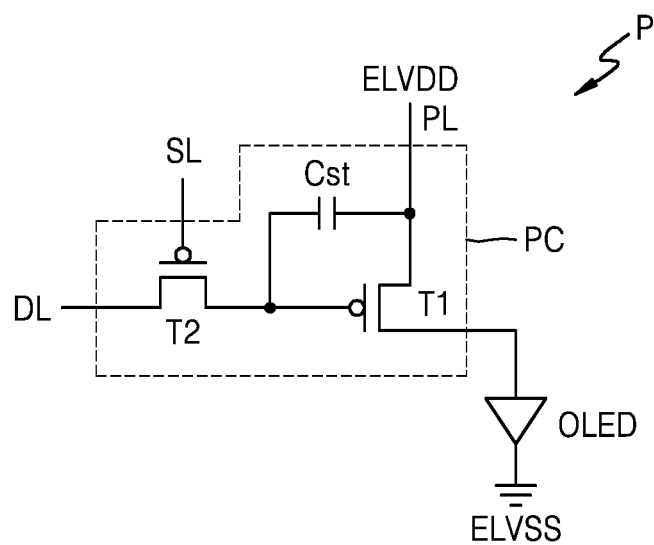
FIG. 21 is an equivalent circuit diagram of one of the pixels of a display panel according to an example embodiment.

FIG. 21 is an equivalent circuit diagram of one of the pixels of a display panel according to an embodiment.

Referring to FIG. 21, each pixel P includes a pixel circuit PC and an organic light-emitting diode OLED as a display element, the display element being connected to the pixel circuit PC. The pixel circuit PC may include a driving transistor T1, a switching transistor T2, and a storage capacitor Cst. Each pixel P may emit, for example, red, green, or blue light or emit red, green, blue, or white light through an organic light-emitting diode OLED. The driving transistor T1 and the switching transistor T2 may be thin film transistors.

The switching transistor T2 is connected to a scan line SL and a data line DL. The switching transistor T2 may transfer a data voltage input from the data line DL to the driving transistor T1 in response to a switching voltage input from the scan line SL. The storage capacitor Cst may be connected to the switching transistor T2 and the driving voltage line PL and may store a voltage corresponding to a difference between a voltage transferred from the switching transistor T2 and the first power voltage ELVDD supplied through the driving voltage line PL.

The driving transistor T1 may be connected to the driving voltage line PL and the storage capacitor Cst and may control a driving current flowing through an organic light-emitting diode OLED from the driving voltage line PL in response to the voltage stored in the storage capacitor Cst. The organic light-emitting diode OLED may emit light having brightness (e.g., predetermined brightness) by using the driving current. An opposite electrode (e.g. a cathode) of the organic light-emitting diode OLED may receive the second power voltage ELVSS.

Though it is shown in FIG. 21 that the pixel circuit PC includes two transistors and one storage capacitor, the embodiment is not limited thereto. The number of transistors and/or the number of storage capacitors may be variously modified depending on a design of the pixel circuit PC.

Figure 22:
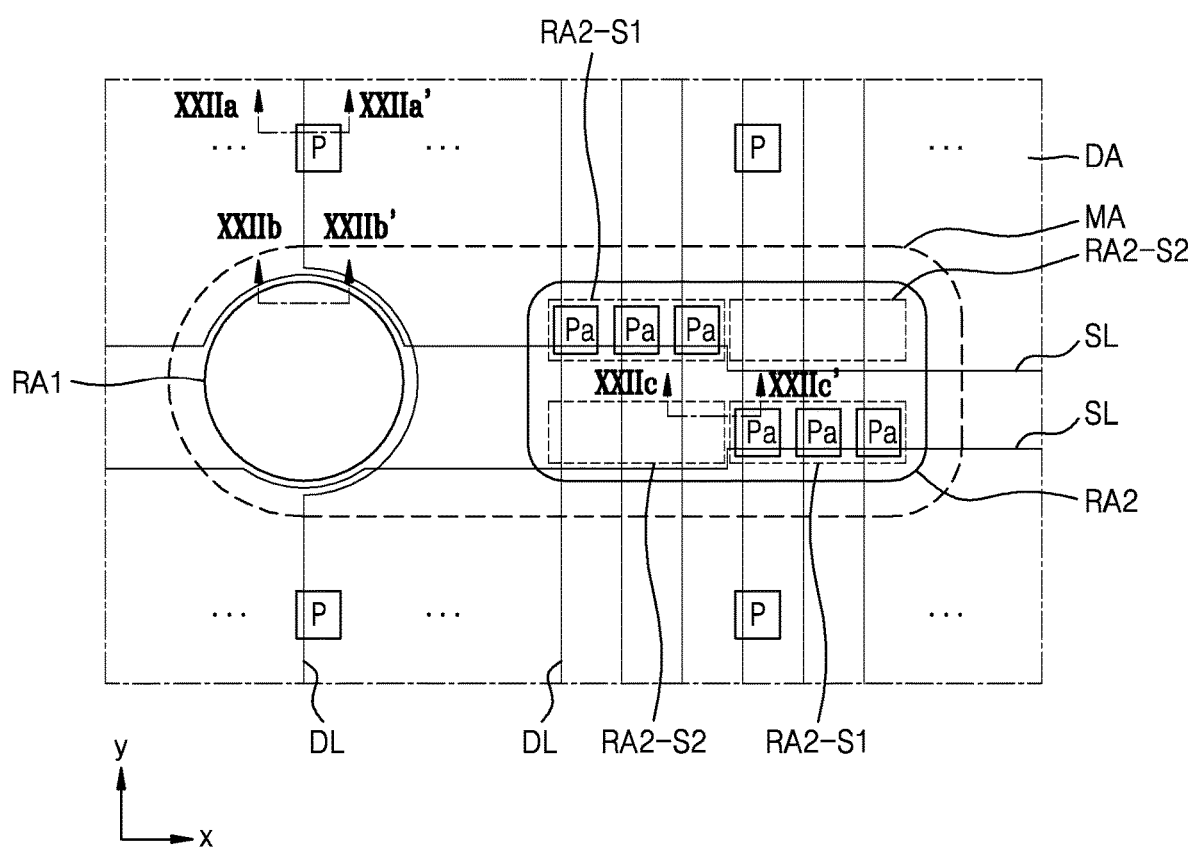
FIG. 22 is a plan view of a first component region, a second component region, and a neighborhood thereof of a display panel according to an example embodiment.

FIG. 22 is a plan view of the first component area RA1 and the second component area RA2 and a neighborhood thereof of a display panel according to an embodiment.

Referring to FIG. 22, the first component area RA1 and the second component area RA2 may be surrounded by the display area DA. A plurality of pixels P are arranged in the display area DA.

In an embodiment, transmittance of the first component area RA1 and transmittance of the second component area RA2 may be different from each other. For example, the first component area RA1 may have a relatively high transmittance, and the second component area RA2 may have a relatively low transmittance. Pixels Pa may be arranged in the second component area RA2. Hereinafter, to distinguish from a pixel P arranged in the display area DA, each pixel Pa arranged in the second component area RA2 is referred to as a second pixel Pa. A second pixel Pa may emit red, green, blue, or white light. A second pixel Pa may be substantially the same as a pixel P in the display area DA. For example, in the case where a pixel P in the display area DA has the same structure as that of the equivalent circuit diagram described with reference to FIG. 21, a second pixel Pa may have the same structure as that of the pixel P.

A scan line SL and a data line DL respectively transferring a scan signal and a data signal to the pixel P and the second pixel Pa may detour along an edge of the first component area RA1 in the intermediate area MA. The scan line SL and the data line DL may pass across the second component area RA2.

The second component area RA2 may include a first sub-area RA2-S1 in which the second pixels Pa are arranged, and a second sub-area RA2-S2 in which pixels are not arranged. Three second pixels Pa arranged in the first sub-area RA2-S1 shown in FIG. 22 may respectively emit red, green, and blue lights. Since the second sub-area RA2-S2 does not include the second pixels Pa, the second sub-area RA2-S2 may be a transmission area through which light that is emitted from the second component arranged in the second component area RA2 or that propagates toward the second component, may pass. Though the second sub-area RA2-S2 corresponds to a kind of transmission area, a wiring such as a data line DL may pass across the second sub-area RA2-S2. Therefore, the transmittance of the second sub-area RA2-S2 may be relatively less than the transmittance of the first component area RA1 across which a data line DL does not pass.

As described above, the first component area RA1 and the second component area RA2 may have different transmittances. With regard to this, cross-sectional structures of the first component area RA1 and the second component area RA2 are described.

First, a cross-sectional structure of the first component area RA1 is described.

Figure 23:
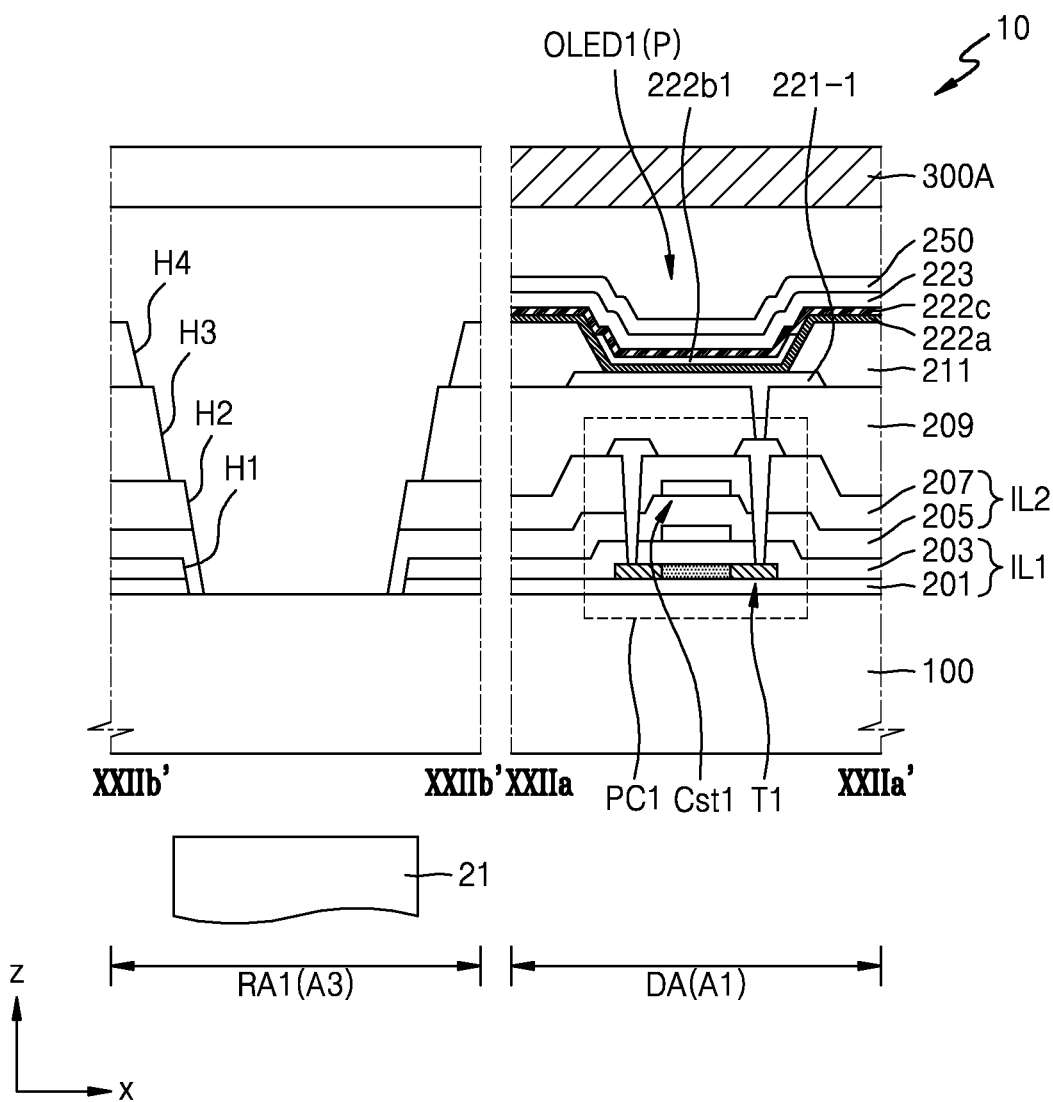
FIG. 23 is a cross-sectional view of a display panel according to an example embodiment.

FIG. 23 is a cross-sectional view of the display panel 10 according to an embodiment and may correspond to a cross-section taken along lines XXIIa-XXIIa' and XXIIb-XXIIb' of FIG. 22.

Referring to the display area DA of FIG. 23, the first pixel circuit PC1 is located on the substrate 100 and electrically connected to the first organic light-emitting diode OLED1. The first pixel circuit PC1 and the first organic light-emitting diode OLED1 may constitute a pixel P described with reference to FIG. 22. The first pixel circuit PC1 may have the same structure as that of the pixel circuit PC described with reference to FIG. 21. Cross-sectional structures of the driving transistor T1 and the first storage capacitor Cst1 included in the first pixel circuit PC1 may be the same as those of the first transistor and the first storage capacitor described with reference to FIGS. 1 to 8. In an embodiment, a cross-sectional structure of the display area DA may be substantially the same as that of the first region A1 described with reference to FIG. 8.

Referring to the first component area RA1 of FIG. 23, insulating layers on the substrate 100 may include holes corresponding to the first component area RA1. For example, the first insulating layer IL1 may include the first hole H1, and the second insulating layer IL2 may include the second hole H2. Also, the planarization layer 209 may include the third hole H3, and the pixel-defining layer 211 may include the fourth hole H4. The first hole H1, the second hole H2, the third hole H3, and the fourth hole H4 may overlap one another. Specific structures of the first hole H1, the second hole H2, the third hole H3, and the fourth hole H4, and a process of forming the first hole H1, the second hole H2, the third hole H3, and the fourth hole H4 may be the same as those of the first hole H1, the second hole H2, the third hole H3, and the fourth hole H4 described with reference to FIGS. 1 to 8. In an embodiment, a cross-sectional structure of the first component area RA1 may be substantially the same as that of the third region A3 described with reference to FIG. 8.

Though it is described with reference to FIG. 23 that cross-sectional structures of the display area DA and the first component area RA1 are respectively substantially the same as those of the first region A1 and the third region A3 described with reference to FIG. 8, the embodiment is not limited thereto. In another embodiment, the cross-sectional structures of the display area DA and the first component area RA1 of the display panel 10 may be respectively and substantially the same as those of the first region A1 and the third region A3 of the display panel 10E described with reference to FIG. 11, 13, or 16. In the case where it is desirable for the first component area RA1 to have a relatively high transmittance, it is preferable that the cross-sectional structures of the display area DA and the first component area RA1 of the display panel 10 are the same as structures of the first region A1 and the third region A3 of the display panel 10E described with reference to FIG. 23 or 13.

Figure 24:
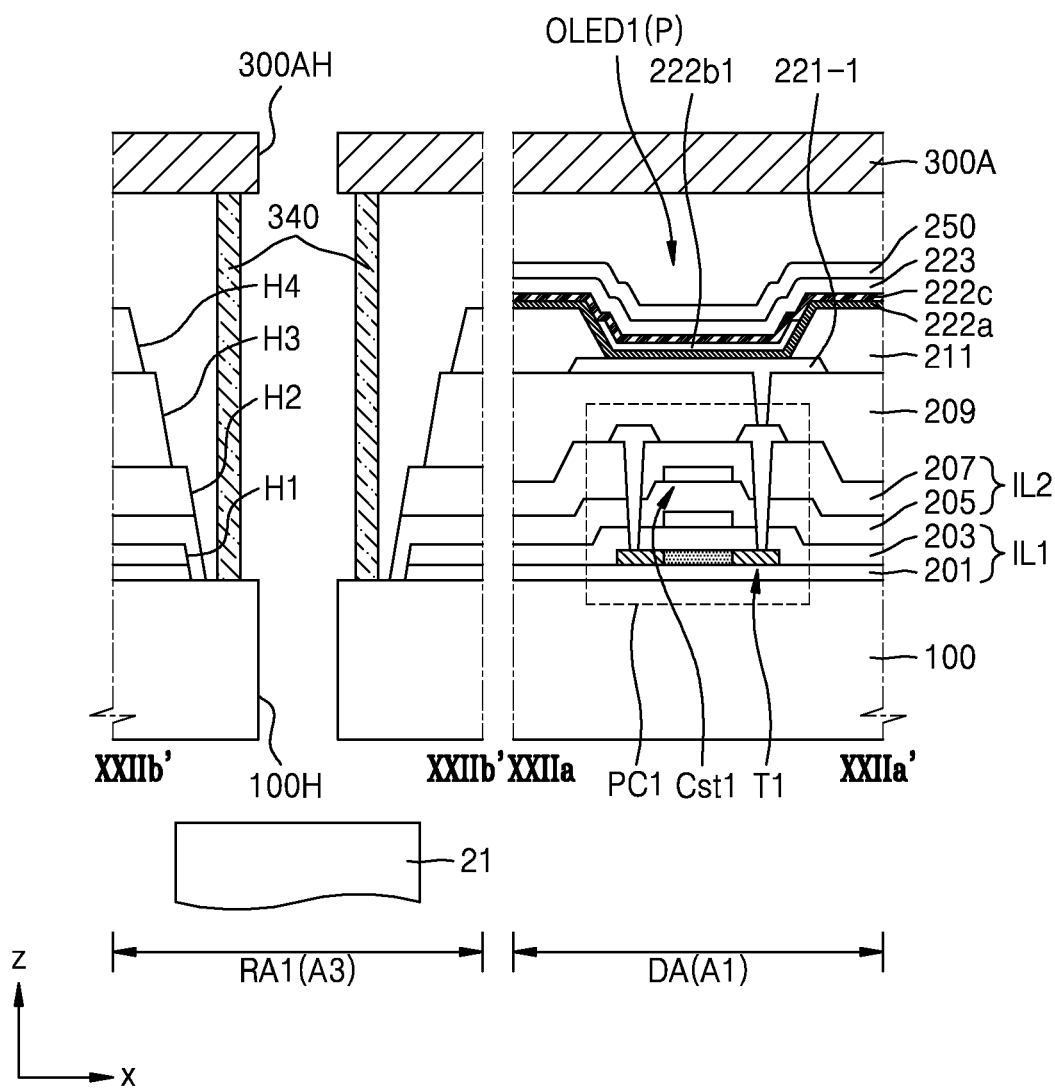
FIG. 24 is a cross-sectional view of a display panel according to another embodiment.

FIG. 24 is a cross-sectional view of a display panel according to another embodiment and corresponds to a modified embodiment of FIG. 23. Since the display area DA of FIG. 24 is the same as the display area DA of FIG. 23, the first component area RA1 is mainly described below.

Referring to the first component area RA1 of FIG. 24, a sealing material 340 may be arranged between the substrate 100 and the encapsulation substrate 300A. The sealing material 340 may prevent or substantially prevent external moisture from progressing toward display elements between the substrate 100 and the encapsulation substrate 300A. As shown in FIG. 24, in the case where the sealing material 340 surrounds a periphery of the first component area RA1, the substrate 100 and/or the encapsulation substrate 300A may respectively include holes 100H and 300H located in the first component area RA1. In this case, compared to the embodiment described with reference to FIG. 23, the transmittance of the first component area RA1 may be improved (e.g., increased) even more.

Though it is shown in FIG. 24 that the first hole H1 is defined in the first insulating layer IL1 including the buffer layer 201 and the gate insulating layer 203, and the second hole H2 is defined in the second insulating layer IL2 including the first interlayer insulating layer 205 and the second interlayer insulating layer 207, the embodiment is not limited thereto. In another embodiment, as described with reference to FIG. 13, the first hole H1 located in the first component area RA1 may be defined in the first insulating layer IL1' including the buffer layer 201, the gate insulating layer 203, and the first interlayer insulating layer 205, and the second hole H2 may be defined in the second insulating layer IL2' including the second interlayer insulating layer 207.

Though FIGS. 23 and 24 show the case in which the encapsulation member includes the encapsulation substrate 300A, the embodiment is not limited thereto. As shown in FIGS. 9, 10, 12, 14, 15, and 17, the encapsulation member may include the thin-film encapsulation layer 300B. The first component area RA1 of the display panel 10 may have the same structure as that of the third region A3 described with reference to FIGS. 9, 10, 12, 14, 15, and 17, or a structure derived therefrom. For example, in the case where it is desired for the first component area RA1 to have a relatively high transmittance, it is preferable that the first component area RA1 of the display panel 10 has the same structure as that of the third region A3 described with reference to FIGS. 10 and/or 15.

Next, a cross-sectional structure of the second component area RA2 is described.

Figure 25:
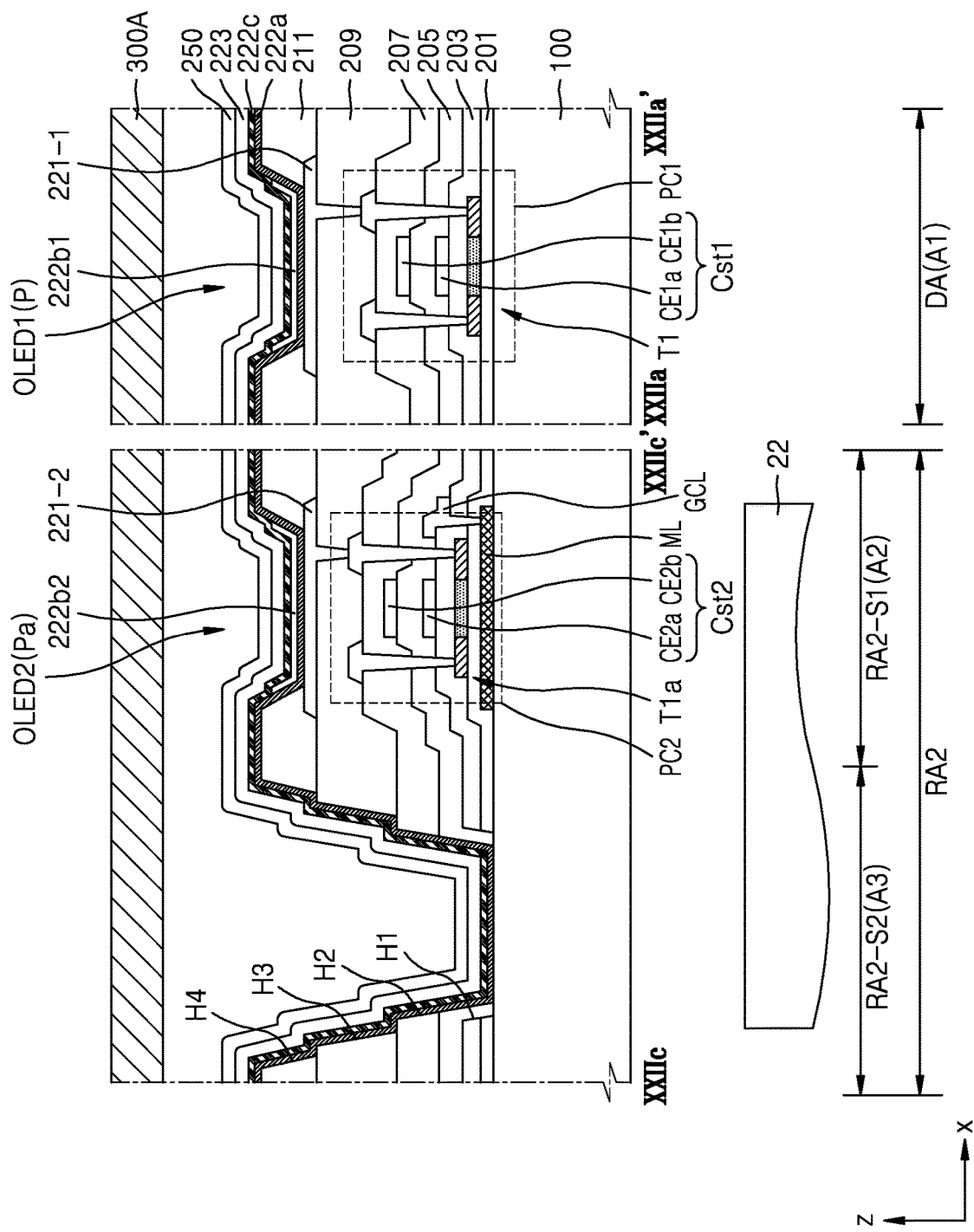
FIG. 25 is a cross-sectional view of a display panel according to another example embodiment.

FIG. 25 is a cross-sectional view of a display panel according to an embodiment and may correspond to a cross-section taken along lines XXIIc-XXIIc' and XXIIb-XXIIb' of FIG. 22.

As mentioned in FIG. 23, a cross-sectional structure of the first component area RA1 of FIG. 25 may have substantially the same structure as that of the first region A1 of the display panel 10A shown in FIG. 8 or the display panel 10C shown in FIG. 11.

Referring to the first sub-area RA2-S1 of the second component area RA2 of FIG. 25, the second pixel circuit PC2 is located on the substrate 100 and electrically connected to the second organic light-emitting diode OLED2. The second pixel circuit PC2 and the second organic light-emitting diode OLED2 may constitute the second pixel Pa described with reference to FIG. 22. The second pixel circuit PC2 may have the same structure as that of the first pixel circuit PC1. Cross-sectional structures of a driving transistor T1a and the second storage capacitor Cst2 included in the second pixel circuit PC2 may be respectively the same as those of the second transistor and the second storage capacitor shown in FIG. 11. In an embodiment, a cross-sectional structure of the first sub-area RA2-S1 may be substantially the same as that of the second region A2 described with reference to FIG. 11. A metal layer ML is arranged below the second pixel circuit PC2. The metal layer ML may prevent or substantially prevent the second pixel circuit PC2 from being damaged or performance of the second pixel circuit PC2 from being deteriorated by light emitted from the second component 22.

Referring to the second sub-area RA2-S2 of the second component area RA2 of FIG. 25, insulating layers on the substrate 100 may include holes corresponding to the second component area RA2.

For example, the first insulating layer IL1 may include the first hole H1, and the second insulating layer IL2 may include the second hole H2. Also, the planarization layer 209 may include the third hole H3, and the pixel-defining layer 211 may include the fourth hole H4. The first hole H1, the second hole H2, the third hole H3, and the fourth hole H4 may overlap one another. Specific structures of the first hole H1, the second hole H2, the third hole H3, and the fourth hole H4, and a process of forming the first hole H1, the second hole H2, the third hole H3, and the fourth hole H4 may be the same as those of the first hole H1, the second hole H2, the third hole H3, and the fourth hole H4 described with reference to FIGS. 1 to 7. In an embodiment, a cross-sectional structure of the second sub-area RA2-S2 may be substantially the same as that of the third region A3 described with reference to FIG. 11. At least one of the first functional layer 222a, the second functional layer 222c, the opposite electrode 223, or the capping layer 250 may be formed in the first hole H1 of the second sub-area RA2-S2.

Though it is described in FIG. 25 that cross-sectional structures of the first sub-area RA2-S1 and the second sub-area RA2-S2 of the second component area RA2 are respectively substantially the same as those of the second region A2 and the third region A3 described with reference to FIG. 11, the embodiment is not limited thereto. In another embodiment, the cross-sectional structures of the first sub-area RA2-S1 and the second sub-area RA2-S2 of the second component area RA2 may be respectively and substantially the same as those of the second region A2 and the third region A3 of the display panel 10G described with reference to FIG. 16.

Though it is shown in FIG. 25 that the encapsulation member includes the encapsulation substrate 300A, the embodiment is not limited thereto. In another embodiment, the encapsulation member may include the thin-film encapsulation layer 300B described with reference to FIG. 9, etc. The cross-sectional structures of the first sub-area RA2-S1 and the second sub-area RA2-S2 of the second component area RA2 of the display panel 10 may respectively have the same structures of the second region A2 and the third region A3 described with reference to FIG. 9, 10, 12, 14, 15, or 17, or a structure derived therefrom. For example, in the case where the second component 22 does not require a high transmittance like an infrared sensor, the first sub-area RA2-S1 and the second sub-area RA2-S2 of the second component area RA2 of the display panel 10 may respectively have the same structures as those of the second region A2 and the third region A3 described with reference to FIG. 9, 12, 14, or 17.

Embodiments may provide a display panel and a display device that may provide various functions while minimizing a process.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, or Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

The display panel and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display panel may be formed on one integrated circuit (IC) chip or on separate IC chips. Further, the various components of the display panel may be implemented on a flexible printed circuit film, a tape carrier package (TCP), a printed circuit board (PCB), or formed on a same substrate. Further, the various components of the display panel may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A display panel comprising:
   a substrate;
   a transistor on the substrate;
   a driving voltage line on the substrate;
   a metal layer between the substrate and the transistor, wherein the metal layer has a same voltage level as that of the driving voltage line;
   a first insulating layer on the metal layer and having a first contact opening, wherein the first insulating layer has a first opening apart from the transistor; and
   a wiring connected to the metal layer through the first contact opening,
   wherein the substrate comprises:
      a first region in which a first display element is positioned;
      a second region in which a second display element is positioned; and
      a third region in which the first opening is positioned,
   wherein the transistor and the metal layer are in the second region and the transistor is electrically connected to the second display element.

2. The display panel of claim 1, wherein the first insulating layer comprises a plurality of sub-layers.

3. The display panel of claim 2, wherein a number of layers defining the first contact opening is the same as a number of layers defining the first opening.

4. The display panel of claim 1, wherein a material change of a lateral surface of the first contact opening in a depth direction of the first contact opening is the same as a material change of a lateral surface of the first opening in a depth direction of the first opening.

5. The display panel of claim 1, further comprising:
   a second insulating layer on the first insulating layer and having a second opening overlapping the first opening.

6. The display panel of claim 5, wherein the second insulating layer further has a second contact opening for connection between a source electrode or a drain electrode of the transistor and a semiconductor layer of the transistor.

7. The display panel of claim 6, wherein the second contact opening passes through a portion of the first insulating layer.

8. The display panel of claim 6, wherein a material change of at least a portion of a lateral surface of the second contact opening in a depth direction of the second contact opening is the same as a material change of a lateral surface of the second opening in a depth direction of the second opening.

9. The display panel of claim 5, wherein a width of the second opening is different from a width of the first opening.

10. The display panel of claim 1, further comprising:
    a storage capacitor on the substrate and electrically connected to the transistor, wherein the driving voltage line is electrically connected to the storage capacitor.

11. The display panel of claim 1, wherein the metal layer is overlapped by a semiconductor layer of the transistor.

12. An electronic device comprising:
    a display panel comprising a component area and a display area at least partially surrounding the component area; and
    a component under the display panel, the component corresponding to the component area;
    wherein the display panel comprises:
       a substrate;
       a first display element on the substrate, the first display element being in the display area;
       a second display element on the substrate, the second display element being in a first sub-area of the component area;
       a transistor on the substrate, the transistor being electrically connected to the second display element;
       a driving voltage line on the substrate;
       a metal layer between the substrate and the transistor, wherein the metal layer has a same voltage level as that of the driving voltage line;
       a first insulating layer on the metal layer and having a first contact opening, wherein the first insulating layer has a first opening apart from the transistor, and wherein the first opening is positioned in a second sub-area of the component area; and
       a wiring connected to the metal layer through the first contact opening.

13. The electronic device of claim 12, wherein the transistor and the metal layer are in the component area.

14. The electronic device of claim 12, wherein the first insulating layer comprises a plurality of sub-layers.

15. The electronic device of claim 14, wherein a number of layers defining the first contact opening is the same as a number of layers defining the first opening.

16. The electronic device of claim 12, wherein a material change of a lateral surface of the first contact opening in a depth direction of the first contact opening is the same as a material change of a lateral surface of the first opening in a depth direction of the first opening.

17. The electronic device of claim 12, wherein the metal layer is overlapped by a semiconductor layer of the transistor.

18. The electronic device of claim 12, wherein the component comprises a sensor or a camera.

* * * * *